United States Patent
Guillon et al.

(10) Patent No.: US 8,584,965 B2
(45) Date of Patent: Nov. 19, 2013

(54) DEVICE FOR INTRODUCING, INJECTING OR SPRAYING A MIXTURE OF A CARRIER GAS AND LIQUID COMPOUNDS AND METHOD FOR IMPLEMENTING SAID DEVICE

(75) Inventors: Hervé Guillon, Montpellier (FR); Samuel Bonnafous, Montpellier (FR); Jean Manuel Decams, Montpellier (FR); Frédéric Poignant, Montpellier (FR)

(73) Assignee: Kemstream, Montpellier (FR)

( * ) Notice: Subject to any disclaimer, the term of this patent is extended or adjusted under 35 U.S.C. 154(b) by 301 days.

(21) Appl. No.: 12/297,861

(22) PCT Filed: Apr. 18, 2007

(86) PCT No.: PCT/EP2007/053805
§ 371 (c)(1),
(2), (4) Date: Oct. 20, 2008

(87) PCT Pub. No.: WO2007/118898
PCT Pub. Date: Oct. 25, 2007

(65) Prior Publication Data
US 2009/0078791 A1    Mar. 26, 2009

Related U.S. Application Data

(60) Provisional application No. 60/810,529, filed on Jun. 1, 2006.

(30) Foreign Application Priority Data

Apr. 19, 2006 (FR) ...................................... 06 51378

(51) Int. Cl.
*A62C 5/02* (2006.01)
*F02M 61/20* (2006.01)
*B05B 7/12* (2006.01)
*B05B 7/06* (2006.01)

(52) U.S. Cl.
USPC .......... 239/8; 239/533.9; 239/417.5; 239/432

(58) Field of Classification Search
USPC ........ 239/398, 8, 5, 533.3, 533.9, 407, 417.5, 239/432
See application file for complete search history.

(56) References Cited

U.S. PATENT DOCUMENTS 5,894,841 A * 4/1999 Voges ..................... 128/203.12
5,945,162 A    8/1999 Senateur et al.
(Continued)

FOREIGN PATENT DOCUMENTS

EP    1038988 A2    9/2000
EP    1098015 A1    5/2001
(Continued)

OTHER PUBLICATIONS

International Search Report, PCT/EP2007/053805, dated Jun. 22, 2007.
(Continued)

*Primary Examiner* — Len Tran
*Assistant Examiner* — Steven M Cernoch
(74) *Attorney, Agent, or Firm* — Pearne & Gordon LLP

(57) ABSTRACT

The invention relates to a device for introducing (1) a carrier gas (2) and liquid compounds (3) or a liquid solution into an evaporation chamber (4), comprising a mixing chamber (10), including at least: —a first inlet (8) for the admission of said compounds or said solution (3), —a second inlet (9) for the admission of the carrier gas (2), —and an outlet (13) connected to an inlet of an injector (14), so that a mixture of carrier gas and droplets of said compounds or of said solution is periodically injected, through a single injector outlet (14), into the evaporation chamber (4).

6 Claims, 13 Drawing Sheets

(56) References Cited

U.S. PATENT DOCUMENTS

| | | | |
|---|---|---|---|
| 6,074,487 | A | 6/2000 | Yoshioka et al. |
| 6,277,201 | B1 | 8/2001 | Nishikawa |
| 6,280,793 | B1 | 8/2001 | Atwell et al. |
| 6,314,979 | B1* | 11/2001 | Lips .................................. 137/3 |
| 6,521,047 | B1 | 2/2003 | Brutti et al. |
| 7,456,116 | B2* | 11/2008 | Ingle et al. ................... 438/787 |
| 2002/0043215 | A1* | 4/2002 | Yoshioka et al. ............. 118/715 |
| 2004/0089730 | A1* | 5/2004 | Toiyama ........................... 239/5 |
| 2005/0126483 | A1* | 6/2005 | Tognetti ........................ 118/715 |
| 2005/0142895 | A1* | 6/2005 | Ingle et al. ................... 438/787 |
| 2006/0180078 | A1 | 8/2006 | Iizuka |

FOREIGN PATENT DOCUMENTS

| | | |
|---|---|---|
| EP | 1643003 A1 | 4/2006 |
| WO | 95/02711 A1 | 1/1995 |
| WO | 98/55668 A1 | 12/1998 |
| WO | 2006/021670 A2 | 3/2006 |

OTHER PUBLICATIONS

International Preliminary Examination Report, FR 0651378, dated Feb. 23, 2007.
International Preliminary Examination Report, FR 0653457, dated Aug. 13, 2007.

* cited by examiner

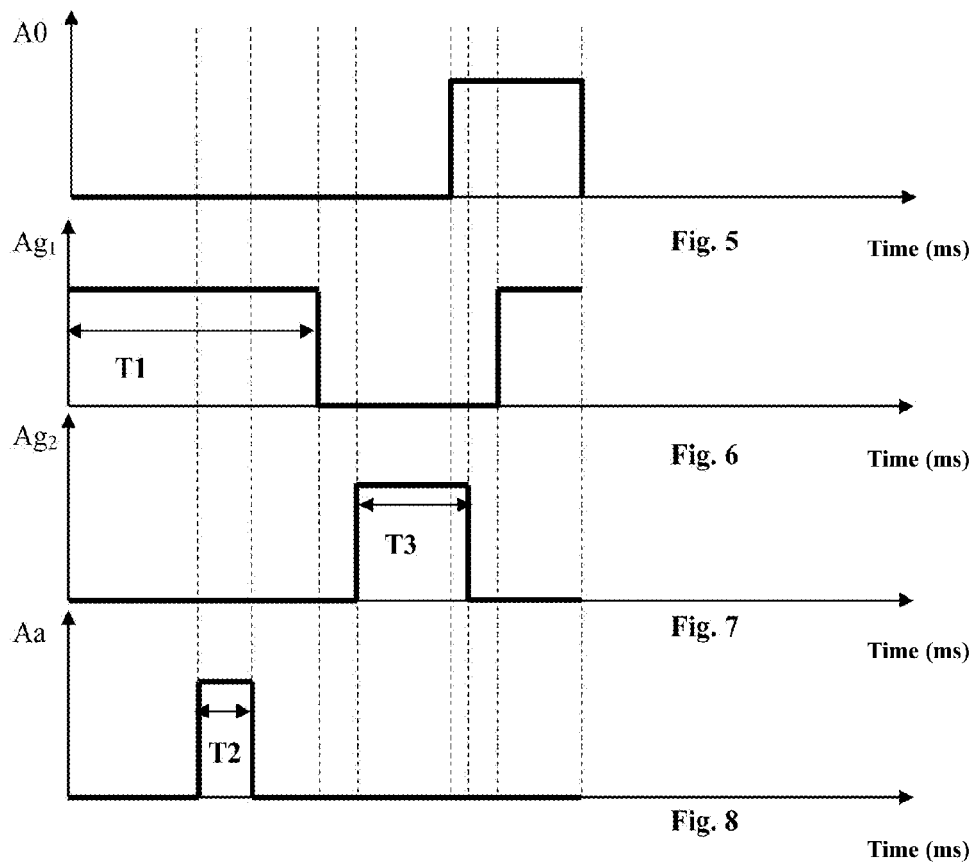
Fig. 5
Fig. 6
Fig. 7
Fig. 8
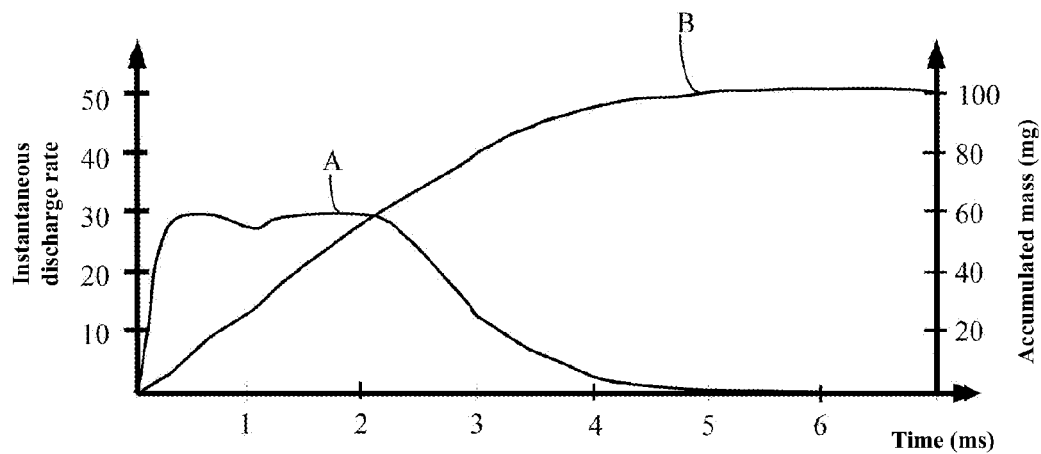
Fig. 9
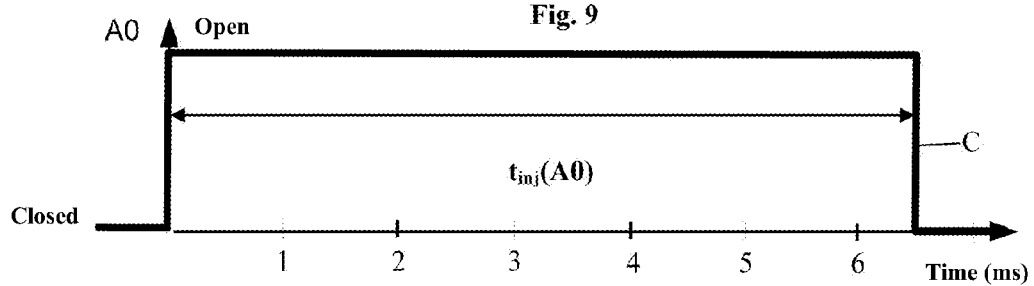
Fig. 10

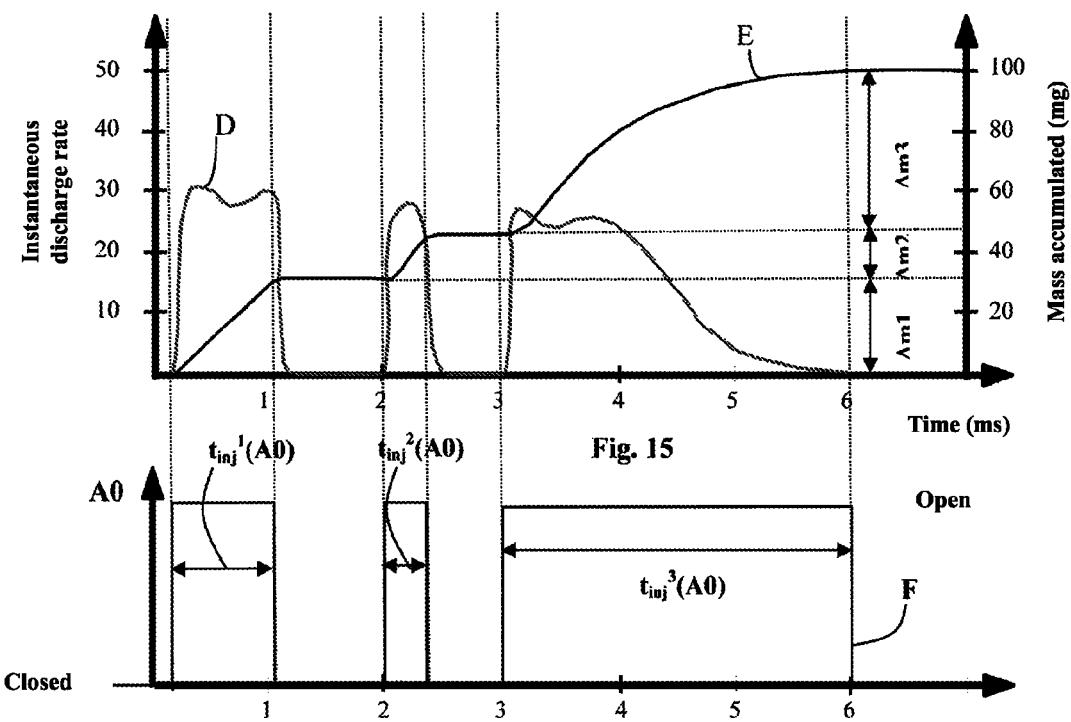
Fig. 15
Fig. 16
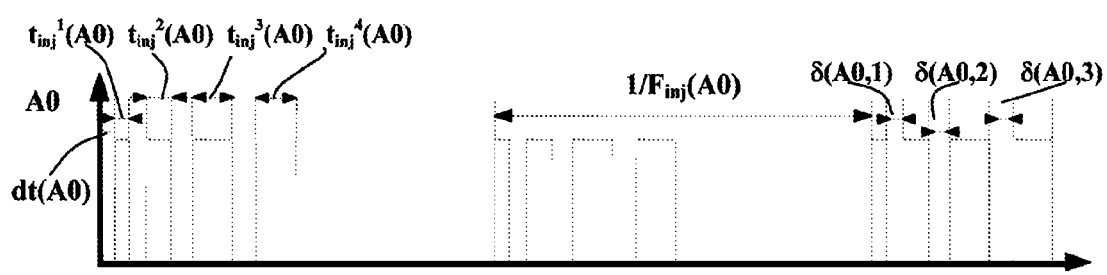
Fig. 17
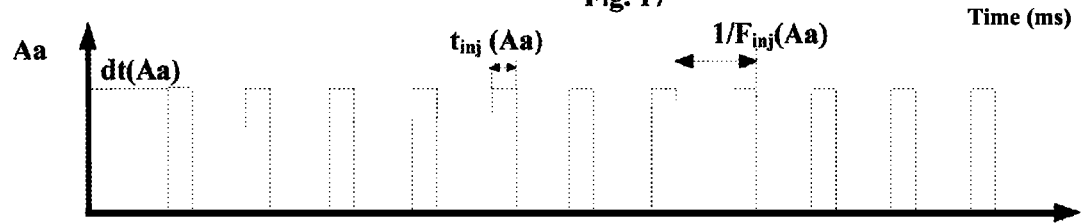
Fig. 18
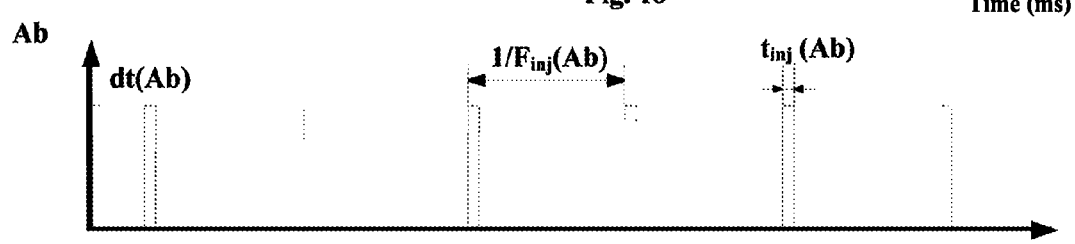
Fig. 19

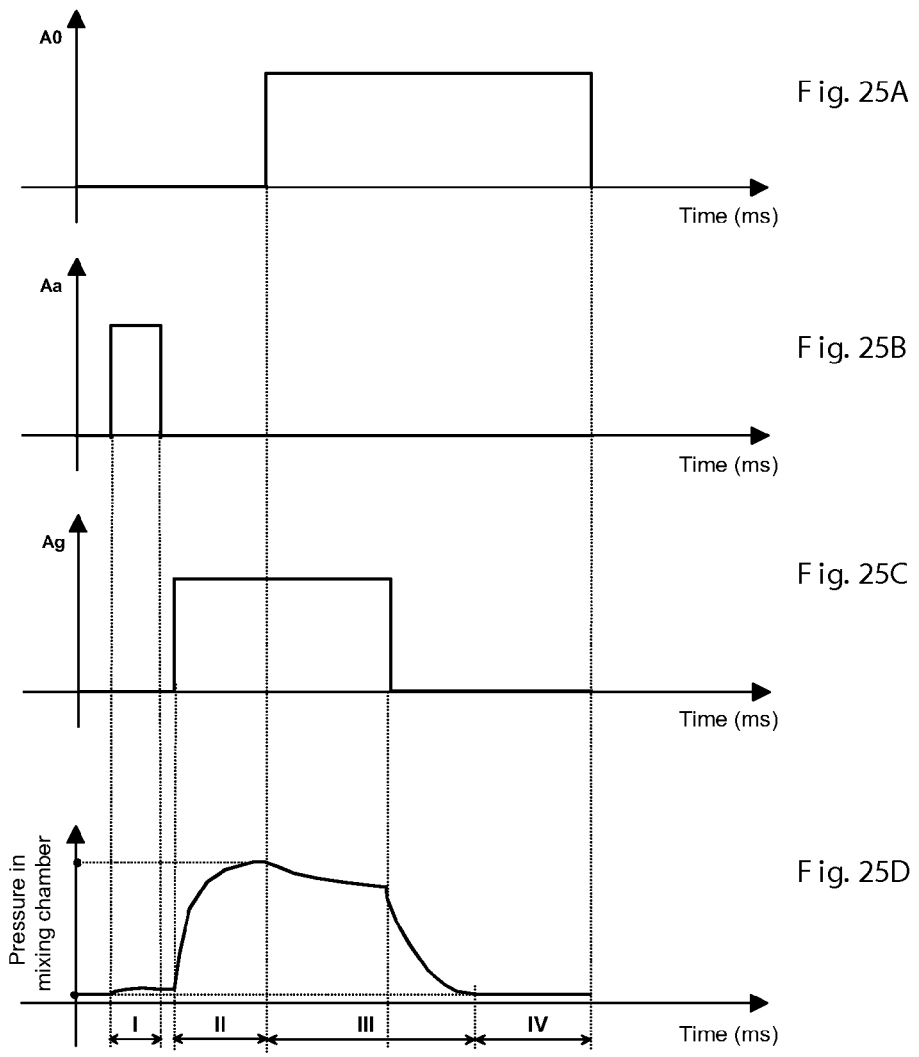
Fig. 25A
Fig. 25B
Fig. 25C
Fig. 25D
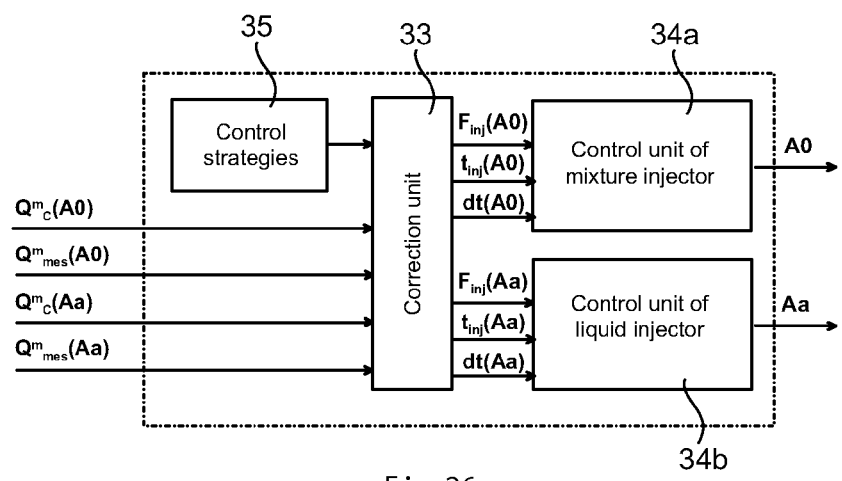
Fig. 26

DEVICE FOR INTRODUCING, INJECTING OR SPRAYING A MIXTURE OF A CARRIER GAS AND LIQUID COMPOUNDS AND METHOD FOR IMPLEMENTING SAID DEVICE

CROSS REFERENCE TO RELATED APPLICATIONS or PRIORITY CLAIM

This application is a national phase of International Application No. PCT/EP2007/053805 entitled "Device for Introducing, Injecting or Spraying Mixture of a Carrier Gas and Liquid Compounds Method Implementing Said Device", which was filed on Apr. 18, 2007, and which claims priority of French Patent Application No. 0651378, filed Apr. 19, 2006 and U.S. Provisional Patent Application No. 60/81,0529, filed Jun. 1, 2006.

TECHNICAL FIELD OF THE INVENTION

This invention relates to a device for introducing, injecting or spraying a carrier gas and liquid compounds or a liquid solution comprising dissolved liquid, solid or gaseous compounds, for example into an evaporation chamber, which device comprises an inlet for admission of said compounds or said solution and control means controlling the injection, introduction or spray, by a first injector, of said liquid compounds or said solution, optionally in said evaporation chamber.

The invention also relates to a method for implementing said device.

PRIOR ART

In the field of chemical vapour deposition (CVD), the compounds or precursors of elements or compounds to be deposited, in the vapour phase, on a substrate are generally introduced into an enclosure, by injection in liquid form. A spray, consisting of fine liquid droplets, is then formed by atomisation of the injected liquid. The compounds or precursors to be deposited can be pure, when they are in liquid form, or they can be dissolved in a solvent when they are in liquid, solid or gaseous form. The liquid droplets are then evaporated in the enclosure, which either directly forms the deposition chamber, or forms an intermediate evaporation chamber coupled to the deposition chamber. In every case, the enclosure is kept at a pressure and temperature allowing for the evaporation of compounds and optionally the deposition reaction on a substrate. In addition, to enable the transport of the vapour-phase compounds in the enclosure, an inert or a reactive carrier gas can be introduced independently into the enclosure.

Thus, in patent application EP-A-0730671, a device for introducing a precursor into a CVD enclosure, or deposition chamber, comprises a tank containing a precursor in liquid form or in a solution. The tank is connected to an injector and the device also comprises means for keeping the tank at a pressure higher than that of the enclosure. The introduction of the precursors is performed by a non-continuous injection of droplets, which injection is controlled by a control circuit enabling precursor droplets, having a predetermined size, to be periodically injected into the deposition chamber. In addition, a carrier gas ensuring the movement of the injected precursor toward the substrate is introduced, separately, by a conduit leading into the enclosure, near the injector.

In patent application EP-A-1098015, the admission head of an evaporation of a CVD installation comprises at least one injector having an inlet for admission of precursors in liquid form or in a solution. A carrier gas heating and injection circuit is arranged so that the carrier gas, introduced directly into the evaporation chamber, is directed near the injector.

However, in such introduction devices, the flow rate of the liquid to be evaporated is dependent on the static flow of the liquid injector. But the liquid injectors commercially available do not always make it possible to obtain flow rates low enough for the desired applications. In this case, it is necessary to significantly reduce the control or injection frequency of the injector, which leads to a substantial fluctuation in the partial pressure of the liquid to be evaporated between two consecutive injections.

Moreover, when the injector is open, the supply line for the liquid to be evaporated is directly in contact with the evaporation chamber (or deposition chamber), thus risking premature evaporation of the liquid within the injector. This premature evaporation can then cause instabilities in the flow injected, in particular when the parameters for controlling the injector such as the injection frequency, the time for which the injector is open and the pressure driving the liquid remain constant. Moreover, if the liquid to be evaporated consists of solid compounds dissolved in a solvent, the injector can also become obstructed during use, which can cause, for constant control parameters of the injector, a regular reduction in the flow injected.

With such devices, it can also be difficult to achieve the spraying and evaporation of the liquid, without allowing it to come into contact with the heated walls of the evaporation chamber, particularly when the liquids to be evaporated are highly viscous and have reduced vapour pressures. Moreover, for predetermined injector control conditions (pressure of the liquid, duration of the opening and frequency of the injector), the flow rate of the sprayed liquid is highly dependent on the pressure inside the evaporation chamber.

OBJECTIVE OF THE INVENTION

The invention relates to a device for introducing, injecting or spraying a carrier gas and liquid compounds, for example in an evaporation chamber, overcoming the disadvantages of the prior art and more specifically enabling the spraying and evaporation of the liquid compounds to be improved.

According to the invention, this aim is achieved by the fact that the inlet for said compounds or said solution constitutes a first inlet of at least one mixing chamber comprising at least one second inlet for admission of the carrier gas and an outlet connected to an inlet of an injector, so that said periodic injection is achieved by injection of a mixture of carrier gas and droplets of said compounds or said solution, by the same outlet of the injector.

The control means can comprise means for regulating the flow rate of the gas and/or liquid, upstream of at least one mixing chamber.

According to another embodiment, the control means comprise means for measuring a flow rate of at least one liquid compound or at least one liquid solution, for example means for comparing a flow rate measured with a flow rate set point.

Means for regulating the flow rate of a carrier gas can also be provided, for example means comprising means for comparing a measured flow rate with a flow rate set point or control point.

An injector or spraying means can be arranged upstream of at least one first inlet of at least one mixing chamber, so as to periodically inject at least one of said compounds or at least one of said solutions into said mixing chamber.

At least one mixing chamber can comprise a plurality of inlets, and a plurality of injectors or spraying means, each of said injectors or spraying means being arranged upstream of one of said inlets of the plurality of inlets. The control means can also control the injector(s) or the spraying means arranged upstream of the inlet(s) of said mixing chamber.

A device according to the invention can comprise a plurality of mixing chambers, each comprising one or more inlets for one or more liquids or one or more liquid solutions or for one or more carrier gases.

A device according to the invention can also comprise control means controlling the periodic injection by said injector of the mixture of carrier gas and droplets. It can also comprise means for regulating the flow rate of the gas and/or liquid upstream of at least one mixing chamber, for example, by controlling one or more injectors arranged upstream of at least one inlet of a mixing chamber.

According to the invention, the device can also comprise at least one injector arranged upstream of the first inlet of at least one mixing chamber, so as to periodically inject said compounds or said solution into the mixing chamber.

According to an alternative, a device according to the invention comprises, upstream of the first inlet of at least one mixing chamber, means for continuously introducing said compounds or said solution into said mixing chamber.

According to another embodiment, the device comprises another injector arranged upstream of the second inlet of the mixing chamber.

According to another development of the invention, the mixing chamber comprises at least one additional inlet so as to introduce an additional liquid into the mixing chamber.

A carrier gas can be introduced into a mixing chamber, directly or by one or more injectors, which can be controlled by the control means already mentioned above. It is also possible to introduce some of the carrier gas directly into an evaporation chamber.

A device according to the invention can also comprise:
 means for pressurizing and/or for regulating the pressure of a liquid compound or a solution, for example, an aqueous solution or an organometallic product dissolved in an organic solvent,
 and/or means for regulating the pressure of a carrier gas,
 and/or temperature control means,
 and/or means for rinsing at least one premixing chamber.

The invention also relates to an evaporation device, comprising:
 an evaporation chamber,
 and a device for introducing or injecting a carrier gas and at least one liquid compound or at least one liquid solution comprising at least one dissolved liquid, solid or gaseous compound, in said evaporation chamber, according to the invention, as described below.

Such a device can also comprise means for introducing the carrier gas directly into the evaporation chamber.

In addition, it is also possible to provide means for measuring a vapour concentration leaving the evaporation chamber, and means for controlling injection parameters according to the concentration measured and a set point.

The invention also relates to an aerosol generating device comprising a device for spraying the carrier gas and at least one liquid compound or at least one liquid solution comprising at least one dissolved liquid, solid or gaseous compound as described above. Such a device can also comprise means for measuring a concentration of at least one of the aerosol components, and for comparing this concentration with a set point of said concentration, and means for controlling the flow rate of the compound or of said solution at the inlet of the mixing chamber.

The invention also relates to a device for injecting or spraying a mixture of a carrier gas and at least one liquid compound or at least one liquid solution comprising at least one dissolved liquid, solid or gaseous compound, which device comprises at least one inlet for admission of said compounds or said solution and control means controlling an injection or a spray, by injection means, of said liquid compound or said solution, which device is characterised in that:
 the inlet for admission of said compound or said solution constitutes at least one first inlet of at least one mixing chamber comprising at least one second inlet for admission of the carrier gas and an outlet connected to an inlet of said injection or spraying means, so that said injection or spray is performed by injecting or spraying a mixture of carrier gas and droplets of said compound or said solution, through a single outlet of said injection or spraying means,
 and in that the control means comprise means for measuring the flow rate of said carrier gas.

The injection or spraying means comprise, for example, a proportional valve.

The control means can comprise a gas flowmeter.

In such a device, injection means can be arranged upstream of the mixing chamber.

Such a device can also comprise means for regulating the injection means according to the flow rate of at least one liquid compound or at least one liquid solution.

The invention also relates to a method for implementing such a device for introducing, injecting or spraying, overcoming the disadvantages of the prior art and making it possible, more specifically, to improve the spraying of liquid compounds.

According to the invention, this aim is achieved by the fact that the implementation method comprises at least the selective control of the injection frequency and/or the duration of the opening of at least one injector, associated with the liquid compound or said solution in the evaporation chamber.

According to a development of the invention, the duration of the opening of at least one injector is controlled so that the entire amount of liquid compounds or of the liquid solution introduced into the mixing chamber between two successive openings of said injector is transferred to the evaporation chamber.

For example, the frequency and/or duration of the opening of said injector is controlled so that the entire amount of liquid compounds or of the liquid solution introduced into the mixing chamber between two successive openings of said injector is injected into an evaporation chamber or is emitted in aerosol form, in a series of injection pulses.

The frequency and/or duration of the opening of at least one injector arranged upstream of the first inlet of a mixing chamber for periodically injecting said liquid compounds or said solution into said mixing chamber can be controlled so that the liquid compounds or the liquid solution are introduced into said mixing chamber in a series of injection pulses.

Preferably, the pressure in an evaporation chamber arranged at the outlet of the injection device is kept lower than that in a mixing chamber, and the pressure in said mixing chamber is kept at a pressure lower than that of the liquid compounds or of the liquid solution, before introduction thereof into said mixing chamber.

It is also possible to control the difference in pressure between the carrier gas and the liquid compounds or the liquid solution, before the respective introduction thereof into the mixing chamber.

BRIEF DESCRIPTION OF THE DRAWINGS

Other advantages and features will become clearer from the following description of specific embodiments of the invention given by way of non-limiting examples and represented in the appended drawings, wherein:

FIGS. 5 to 8 show a particular method for varying the control signals, respectively A0, Ag1, Ag2 and Aa of the different injectors shown in FIG. 4, as a function of time.

FIG. 9 shows the instantaneous discharge rate and the accumulated mass of the liquid portion of the mixture injected into the evaporation chamber as a function of time, following a control pulse A0 shown in FIG. 10 and after a prior introduction of the liquid compound or the solution into the mixing chamber.

FIGS. 11 and 26 diagrammatically show means for controlling the injectors of devices according to the invention.

FIG. 15 shows the instantaneous discharge rate and the accumulated mass of the liquid portion of the mixture injected into the evaporation chamber as a function of time, following a train of control pulses A0 shown in FIG. 16 and after a prior introduction of the liquid compound or the solution into the mixing chamber.

FIGS. 17 to 19 show a particular mode for varying the control signals A0, Aa and Ab of the different injectors of a device according to the invention, as a function of time, wherein the periodic control of the injector intended to introduce the mixture of carrier gas and liquid into the evaporation chamber is a pulse train consisting of four distinct pulses.

FIGS. 25A to 25C show another particular mode for varying the control signals A0, Aa and Ag of the different injectors of a device according to the invention.

FIG. 25D shows the change over time in the pressure in the mixing chamber according to the mode for varying the control signals.

FIG. 26 shows a device for implementing a closed-loop control.

DESCRIPTION OF SPECIFIC EMBODIMENTS

Figure 1:
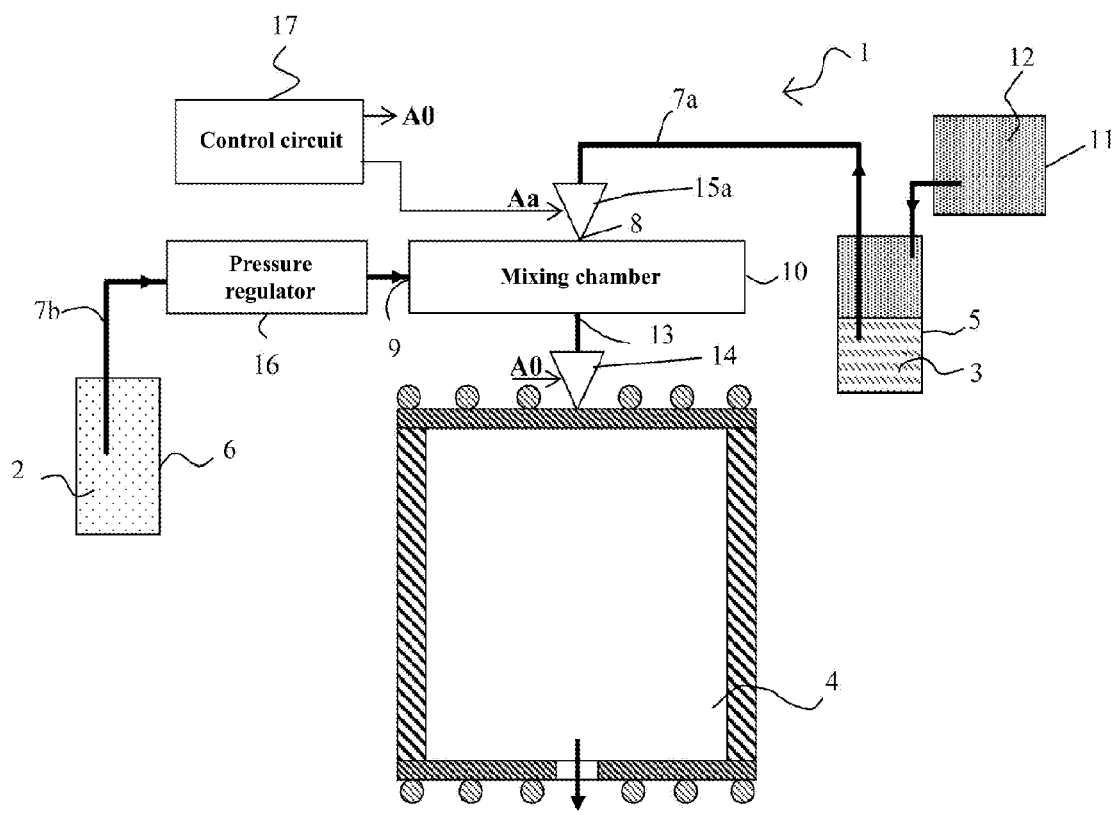
FIGS. 1 to 4 show various embodiments of a device for introducing a mixture of carrier gas and liquid compounds or a liquid solution into an evaporation chamber, according to the invention.

According to a specific embodiment shown in FIG. 1, an evaporator device comprises a device for introducing 1 a carrier gas 2 and a liquid 3, connected to the upper portion of a chamber 4 intended to enable the evaporation of the liquid 3. The term liquid refers to one or more liquid compounds or a liquid solution comprising one or more dissolved solid, liquid or gaseous compounds.

The evaporator device can be an evaporator device of a chemical vapour deposition (CVD) installation, an atomic layer deposition (ALD) installation, a molecular vapour deposition (MVD) installation, a vapour-phase chemical reaction installation, an installation for vapour recondensation on a substrate or any other process chamber using vapours resulting from the evaporation of a compound or of a precursor liquid. Thus, the liquid 3 can be either a precursor of an element to be deposited or said element, and it can be pure or in a solution or dissolved in a solvent. In addition, the evaporation chamber 4 can be a thermostatically controlled enclosure intended solely for the evaporation of the liquid 3, and connected, by its lower portion, to a process or deposition chamber. The evaporation chamber 4 can also be said process chamber. The structure of the evaporation chamber is of any known type and comprises heating means and pressurizing means allowing for the evaporation of the liquid droplets.

The introduction device 1 comprises tanks 5 and 6 respectively containing the liquid 3 and the carrier gas 2 and respectively connected, by conduits or supply lines 7a and 7b, to first and second inlets 8 and 9 of a mixing chamber 10. The tank 5 of liquid 3 is also connected to a tank 11 of pressurised gas 12, also called a driving gas, so as to enable the introduction of the pressurised gas 12 through the upper portion of the tank 5. The pressurised gas 12 enables a high pressure $P_1$ to be maintained in the tank 5 and, more specifically, higher than the pressure of the mixing chamber 10. Pressurisation means can allow for a very precise control of the liquid driving pressure, as shown in FIGS. 20A and 20B, which partly use reference signs identical to those of FIG. 1.

Figure 20A:
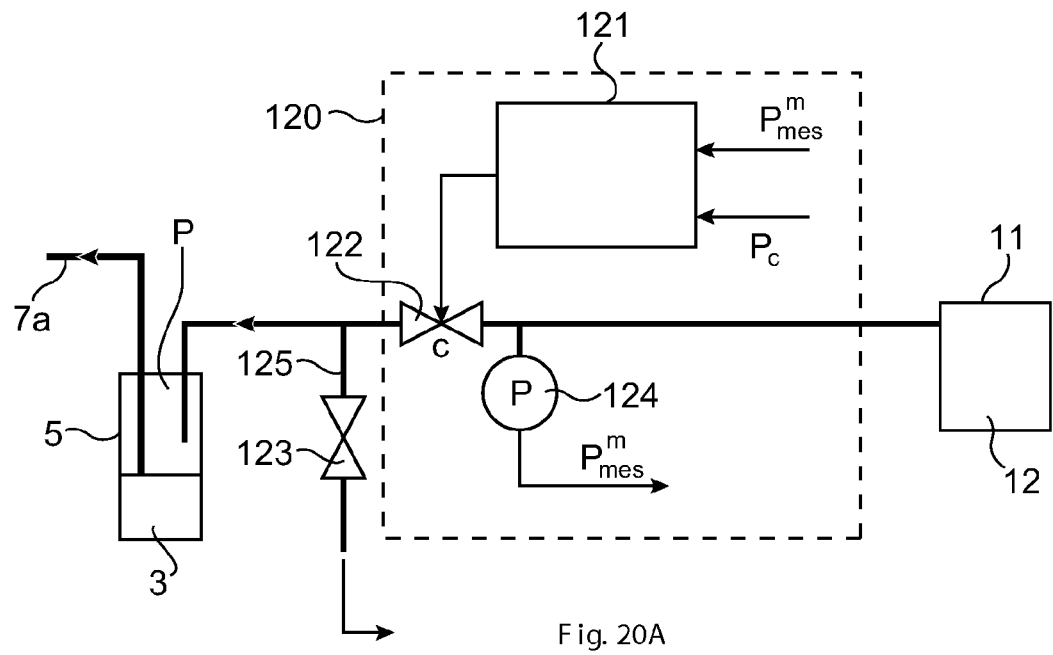
FIGS. 20A, 20B, 21A, 21B, and 22 to 24 show alternative embodiments of a device for introducing a mixture of carrier gas and liquid compounds or a liquid solution into an evaporation chamber, according to the invention.

In the diagram of FIG. 20A, regulation means 120 comprise calculation means 121 for implementing an algorithm for regulation of the pressure driving the liquid 3, based on a measured pressure $P^m{}_{mes}$ and a pressure set point or control point $P_c$. These means 121 regulate the opening of a proportional valve 122 arranged on the path between tank 11 and tank 5. A valve 123 is arranged on a leakage line 125, connected, for example, to a vacuum pump (not shown in the figure). Pressure sensing means 124 supply the means 121 with a pressure value $P^m{}_{mes}$ measured on the line connecting the two tanks 11 and 5.

Figure 20B:
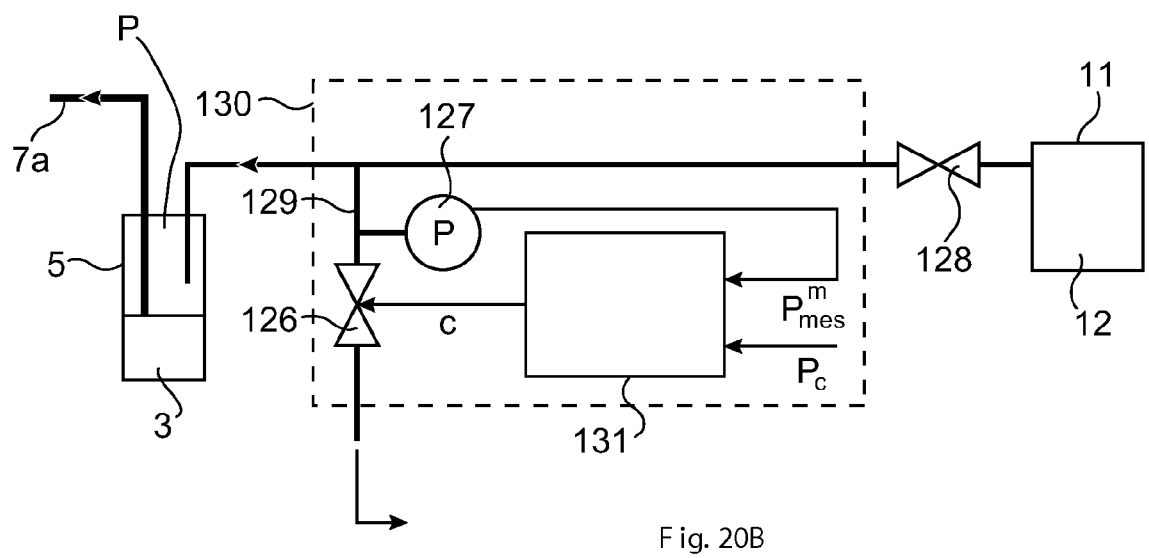

In the diagram of FIG. 20B, regulation means 130 comprise calculation means 131 implementing an algorithm for regulation of the pressure driving the liquid 3, based on a measured pressure $P^m{}_{mes}$ and a pressure set point $P_c$. These means 131 regulate the opening of a proportional valve 126 arranged on a line 129, connected, for example, to a vacuum pump (not shown in the figure), and to the main line arranged between tank 11 and tank 5. A leak valve 128, for example, manually controllable, is arranged on this same main line. Pressure sensing means 127 supply the means 131 with a pressure value $P^m{}_{mes}$, measured on the line 129, between the valve 126 and the point of connection between the line 129 and the main line. This pressure $P^m{}_{mes}$ is therefore equal to the pressure in the main line.

The mixing chamber 10 also comprises an outlet 13 connected to the inlet of an injector 14 intended to periodically inject, through a single outlet, the contents of the mixing chamber 10. Thus, when the mixing chamber 10 contains both the carrier gas 2 and the liquid 3, the injector 14 injects, into the evaporation chamber 4, a mixture of carrier gas 2 and droplets of liquid 3. Thus, the injector 14 can also be called a mixture injector. However, if the mixing chamber 10 contains only the carrier gas, only it will be injected into the evaporation chamber 4.

The introduction of the liquid 3 into the mixing chamber 10 can be performed using any type of means. More specifically, the liquid 3 can be periodically introduced into the mixing chamber 10 by means of an injector 15a, also called a liquid injector and arranged upstream of the first inlet 8 of the mixing chamber 10.

Figure 21A:
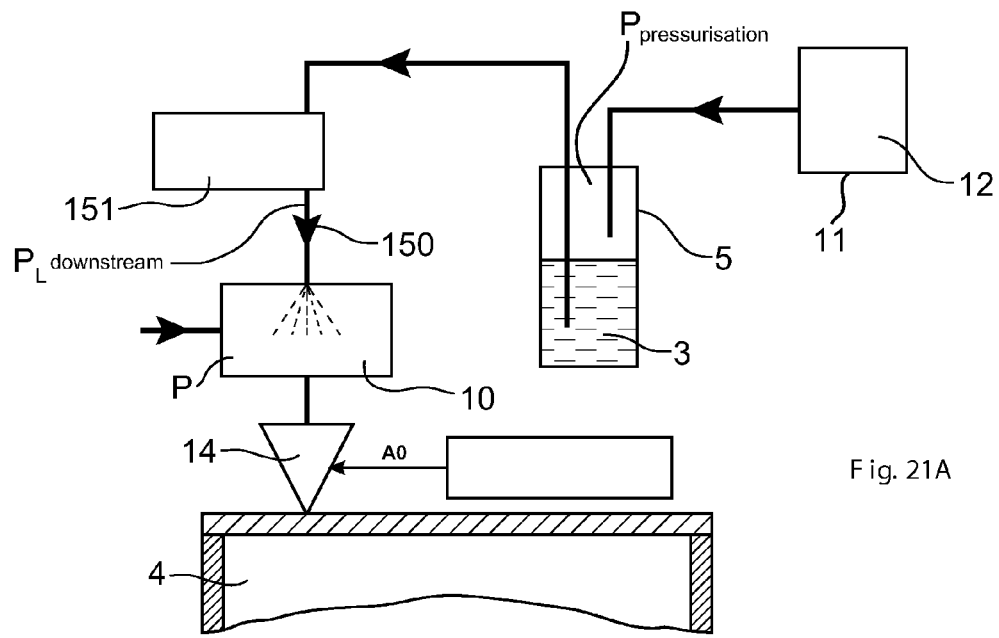

According to an alternative, the liquid 3 can be continuously introduced into the mixing chamber 10, using, for example, a "Mass Flow Controller", or a device 151 for regulating the mass flow for liquid, associated with a spray nozzle 150 (FIG. 21A). This device 151 comprises a valve (not shown in FIG. 21A). In this case, varying the liquid flow rate amounts to modifying the position of said valve, which modifies the $C_v$ (the "flow coefficient") as well as the pressure of the liquid downstream of the valve. The geometric characteristics of the spray nozzle 150 are preferably adapted so that, in the liquid flow rate range desired for the applications, the pressure of the liquid downstream of the restriction constituted by the valve is greater than the pressure in the mixing chamber 10. Such a device does not require an extremely precise pressure regulation.

Figure 21B:
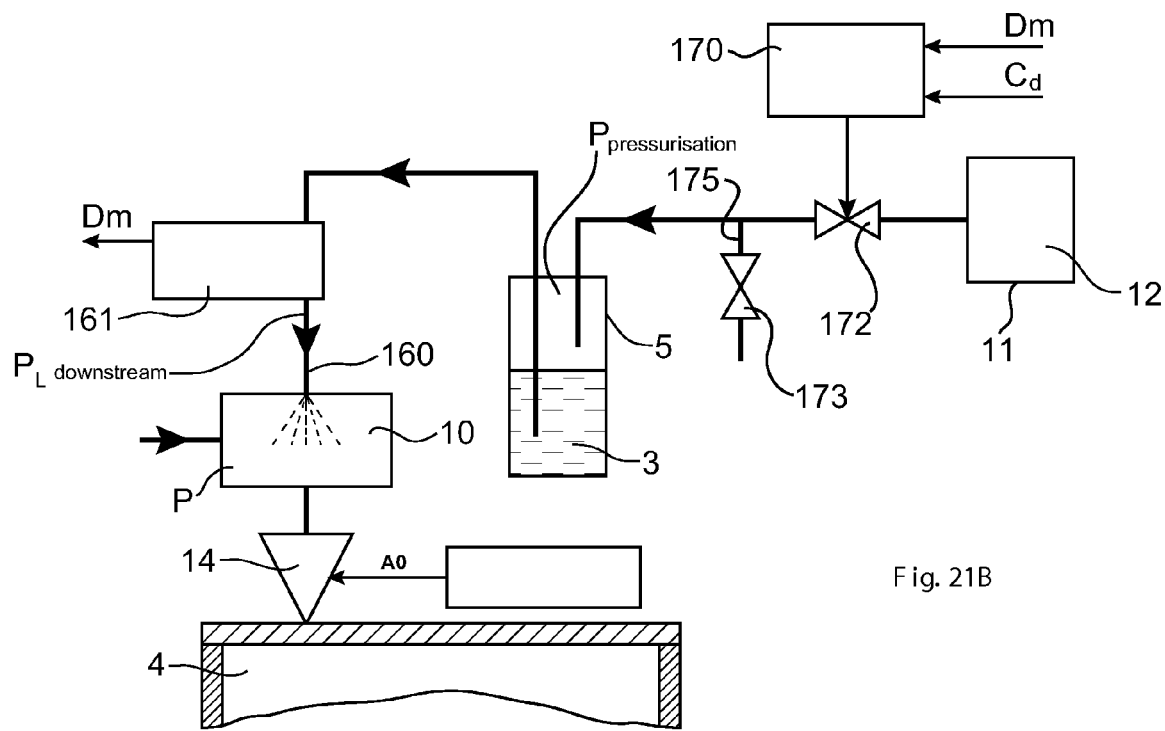

According to yet another alternative, the liquid can also be introduced continuously using a "Mass Flow Meter" for liquid, or device 161 for measuring the mass flow, which does not include a controllable valve, and which provides a flow rate measurement $Q^m{}_{mes}$ and which is associated with a spray nozzle 160 (FIG. 21b). In this case, varying the liquid flow rate amounts to modifying the driving pressure exerted on it. In this case as well, the diameter of the spray nozzle is adapted according to the desired liquid flow rate range. Regulation means comprise calculation means implementing an algorithm for regulation of the liquid 3 flow rate, based on a measured flow rate $Q^m{}_{mes}$ and a flow rate set point or control point $Q^m{}_c$. These means 170 regulate the opening of a proportional valve 172 arranged on the path between tank 11 and tank 5. A valve 173 is arranged on a leak line 175, connected, for example, to a vacuum pump (not shown in the figure). The regulation of the liquid flow rate is performed by controlling the proportional valve 172 and therefore the pressurisation of the liquid.

Consequently, according to an alternative embodiment, the liquid 3 can be continuously introduced into the mixing chamber 10, with the flow rate of the liquid 3 introduced into the chamber being, for example, regulated by means of a proportional valve or a device for regulating the flow rate arranged upstream of the first inlet of the mixing chamber 10.

The introduction of the carrier gas 2 into the mixing chamber 10 can also be performed by any type of means. More specifically, the carrier gas 2 is introduced continuously into the mixing chamber 10, with a pressure regulator 16 being arranged between the tank 6 and the second inlet 9 of the mixing chamber 10. The pressure regulator 16 is preferably intended to maintain the carrier gas, upstream of the second inlet of the mixing chamber, at a pressure $P_g$ greater than the pressure in the evaporation chamber 4.

Means for measuring the mean flow rate and/or the instantaneous discharge rate of the carrier gas and means for preheating the carrier gas can also be arranged upstream of the second inlet 9. However, a sudden variation in the pressure in the gas supply line may appear when the mixture injector 14 is open. The pressure regulator 16 alone cannot always overcome this satisfactorily, thereby presenting a problem when a measurement of the carrier gas flow rate is to be performed simultaneously. Indeed, the flow rate measuring means such as "Mass Flow Meters" or "Mass Flow Controllers" can provide an incorrect measurement of the flow rates when the pressures are not sufficiently stabilised. To prevent, or at least limit, this phenomenon, it is possible to use, downstream of the flowmeter, a buffer volume much greater than the volume of the mixing chamber 10, which is intended to limit the variations in pressure resulting from the opening of the mixture injector 14.

In addition, the gas volume contained in the mixing chamber 10 is preferably much greater than the liquid 3 volume contained in the mixing chamber 10.

A control circuit 17 provides control signals A0 and Aa respectively intended to control the opening and closing of the injectors 14 and 15a. The control signals are preferably binary logic control signals.

The flow rate of the carrier gas 2 introduced into the evaporation chamber 4 is dependent on the composition of the mixture injected and, in particular, the amount of liquid present in the mixing chamber, the static flow of the mixture injector 14 under the pressure conditions of the mixing 10 and evaporation 4 chambers, the total duration of the opening of the injector 14 during a control period and the injection frequency of the injector 14.

In addition, the temperature in the introduction device can be controlled by circulation of water or heat transfer fluid or by blowing air around the constituents of the device and in particular around the mixing chamber and the injectors. Such means for controlling the temperature of the introduction means make it possible to maintain the temperature of the upper portion of the evaporation chamber 4, in particular in the vicinity of the point of connection with the mixture injector 14 nozzle, at a value as close as possible to the temperature of the evaporation chamber 4, so as to prevent any recondensation of the vaporised products, while performing an effective cooling of the mixture injector, for example the coil thereof, and the mixing chamber 10. The cooling with air can be performed with a fan that blows over the injectors and the mixing chamber, wherein the injectors and the mixing chamber are contained in a radiator, consisting of two half-shell sections, which houses them and which is made of a thermally conductive material, such as aluminium, for example.

Thus, the introduction, into the evaporation chamber 4, simultaneously and through the same outlet opening of an injector 14, of a mixture of a carrier gas and liquid, makes it possible to obtain very fine liquid droplets because the carrier gas injected simultaneously with the liquid causes a dispersing blast effect on the liquid. Their mean diameter is much smaller than that of the droplets injected by means of introduction devices according to the prior art and in which the carrier gas and the liquid are introduced separately into the evaporation chamber. The size distribution of the droplets is also narrower than that obtained by the introduction devices of the prior art. The introduction device according to the invention therefore makes it possible to improve the atomisation of the droplets while the mean speed of the droplets, at the outlet of the mixture injector, remains comparable to that observed for droplets injected by devices according to the prior art, with the pressure in the mixing chamber being comparable to the liquid driving pressures generally implemented in these devices. The evaporation kinetics are therefore notably improved and the risk of contact between droplets not yet evaporated and the heated walls of the evaporation chamber is significantly reduced. Thus, unlike the introduction devices according to the prior art, it is possible, with an introduction device according to the invention, to reduce the critical sizes of the evaporation chamber. The term critical size refers to the minimum sizes required in order for the injected droplets to entirely evaporate before reaching the walls of the evaporation chamber. The evaporation of droplets can then be performed without contact with the evaporation chamber walls, in a restricted volume, and the risks of formation of particles and fouling of the evaporation chamber remain limited.

Figure 22:
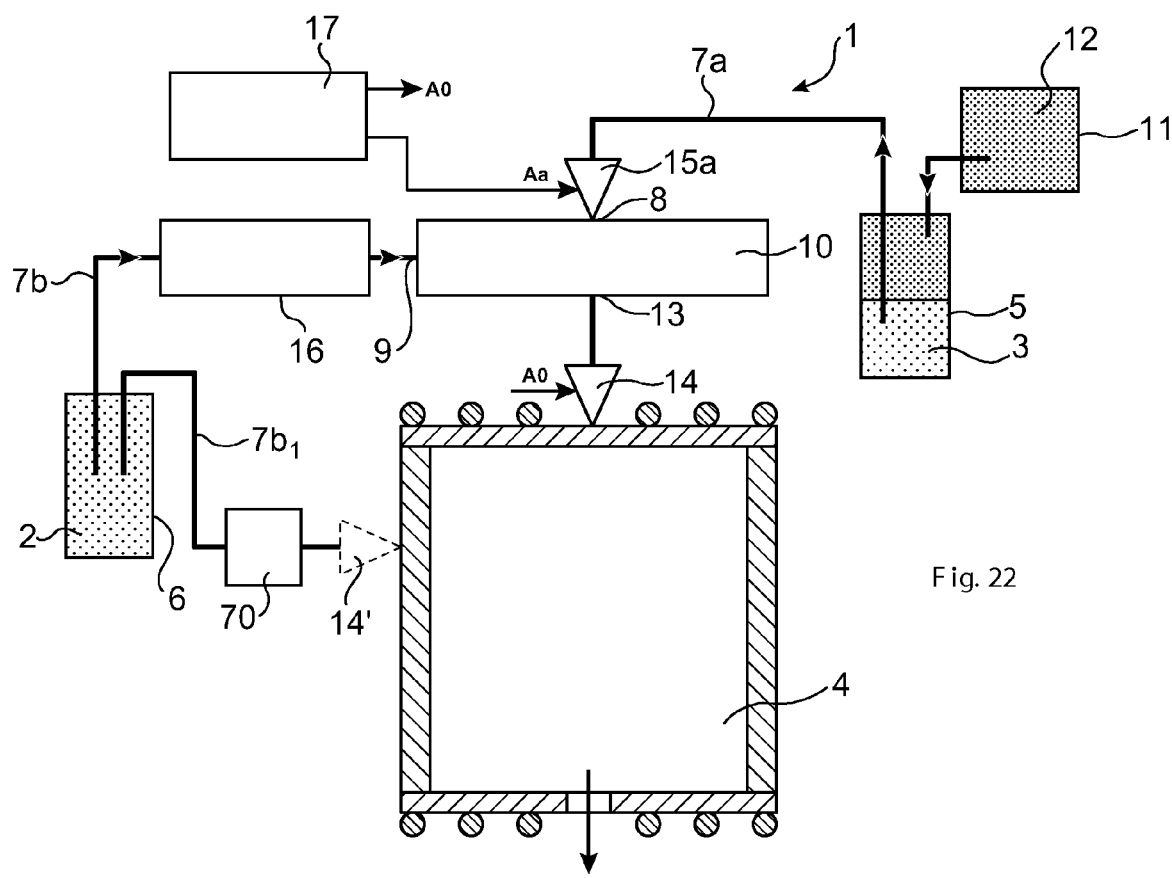

Moreover, the introduction device can comprise additional means for introducing the carrier gas 2, directly into the evaporation chamber 4 and preferably in the vicinity of the injector 14. Thus, as shown in FIG. 22, it can comprise a second line 7$b_1$ for injection of the carrier gas directly connected to the evaporation chamber 4. The direct introduction of the carrier gas into the evaporation chamber can be continuous, with a flow rate controlled by means 70 for controlling the carrier gas flow rate, for example with a flowcontroller regulating the mass flow of gas. The introduction of the carrier gas into the evaporation chamber by a dedicated line can also be performed using an injector 14' intended to periodically inject an amount, predetermined or not, of carrier gas 2 into the evaporation chamber 4. In both cases, the means for direct injection of the carrier gas can comprise means for measuring the flow rate and/or means for regulating said flow rate.

Figure 23:
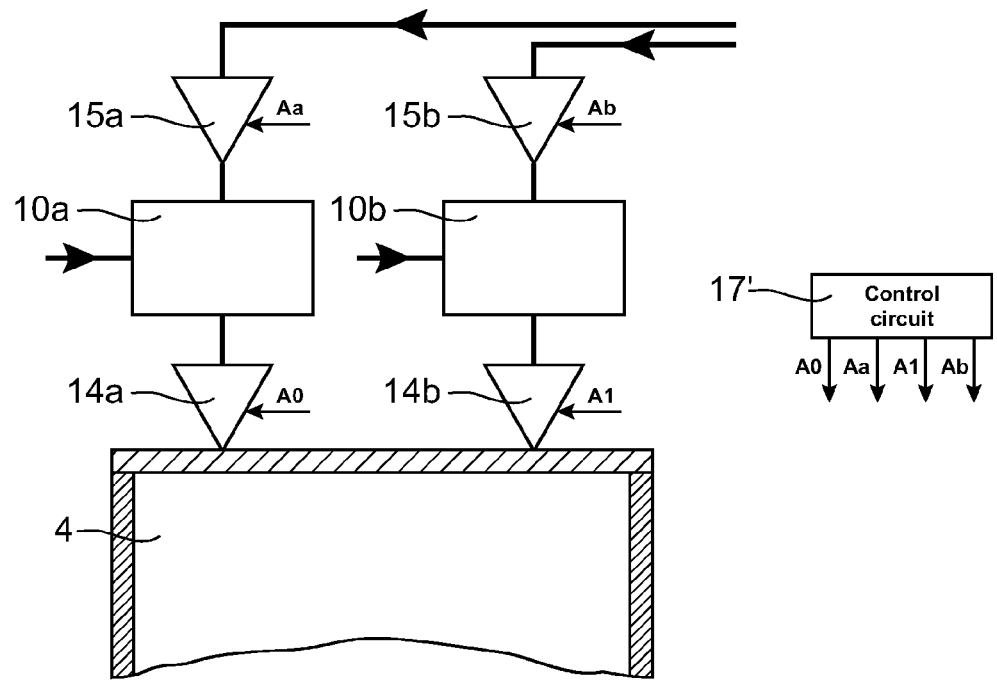

A device according to the invention can also comprise a plurality of injection "heads" such as those described above, wherein each head comprises a mixing chamber 10, a mixture injector 14 and a liquid injector 15a, and the different injection "heads" are arranged on a single evaporation chamber 4. Such a configuration is shown in FIG. 23, with two mixture injectors 14a, 14b, each associated with a mixing chamber 10a, 10b, and each supplied with liquid by a liquid injector 15a, 15b. At least one of the chambers 10a, 10b could also be supplied by a plurality of injectors as in FIGS. 2 to 4, or by a combination of injectors and valves as in FIG. 24. A circuit, or control means 17', control(s) the opening of the various injectors 15a, 15b, 14a, 14b. The features disclosed above in reference to FIGS. 20A to 21B can be applied to each liquid supply line.

The introduction device is not limited to the embodiments already described, in particular not to the introduction of a single liquid or a plurality of liquids into the evaporation chamber. Thus, in FIG. 2, the introduction device 1 comprises, in addition, a tank 18 containing an additional liquid 19 intended to be introduced into the mixing chamber 10, then into the evaporation chamber 4. The additional tank 18 is connected to an additional inlet of the mixing chamber 10 by a conduit 20 and an additional injector 15b is arranged upstream of the additional inlet of the mixing chamber 10. The injector 15b makes it possible to inject, for example, periodically, the additional liquid 19 into the mixing chamber 10. The additional liquid 19 can be, for example, a solvent intended to flush the mixing chamber 10 and the injector 14 or to dilute the liquid 3. In the case of a rinsing of the chamber 10 and the injector 14 with the second liquid 19, the injector 15b will preferably operate continuously. In the case of another possible application, namely dilution of the liquid 3, a pulsed operation of the injector 15b may be implemented.

Another possible application, with one or more additional liquids, is, in chamber 4, an alternating deposition of layers of different materials (multilayers) or a deposition of a multi-element material. This application is also possible with two distinct injection heads on the same evaporation chamber, as explained above, in particular in reference to FIG. 23 or one of the alternatives thereof.

In addition, an additional conduit 21 equipped with a valve 22a can also be arranged between the tank 18 and the conduit 7a intended to transport the liquid 3 from the tank 5 to the mixing chamber 10, so as to flush said conduit and the injector 15a. The conduit 7a is equipped with a valve 22b, arranged between the point of connection of the conduits 7a and 21 and the tank 5. The valve 22b thus makes it possible to isolate the tank 5 in the flushing operation. Like tank 5, tank 18 containing the additional liquid 19 is also connected to a pressurised gas tank 23, and the control circuit 17 can also provide a control signal Ab, preferably a binary logic signal, controlling the opening and closing of the injector 15b.

Figure 24:
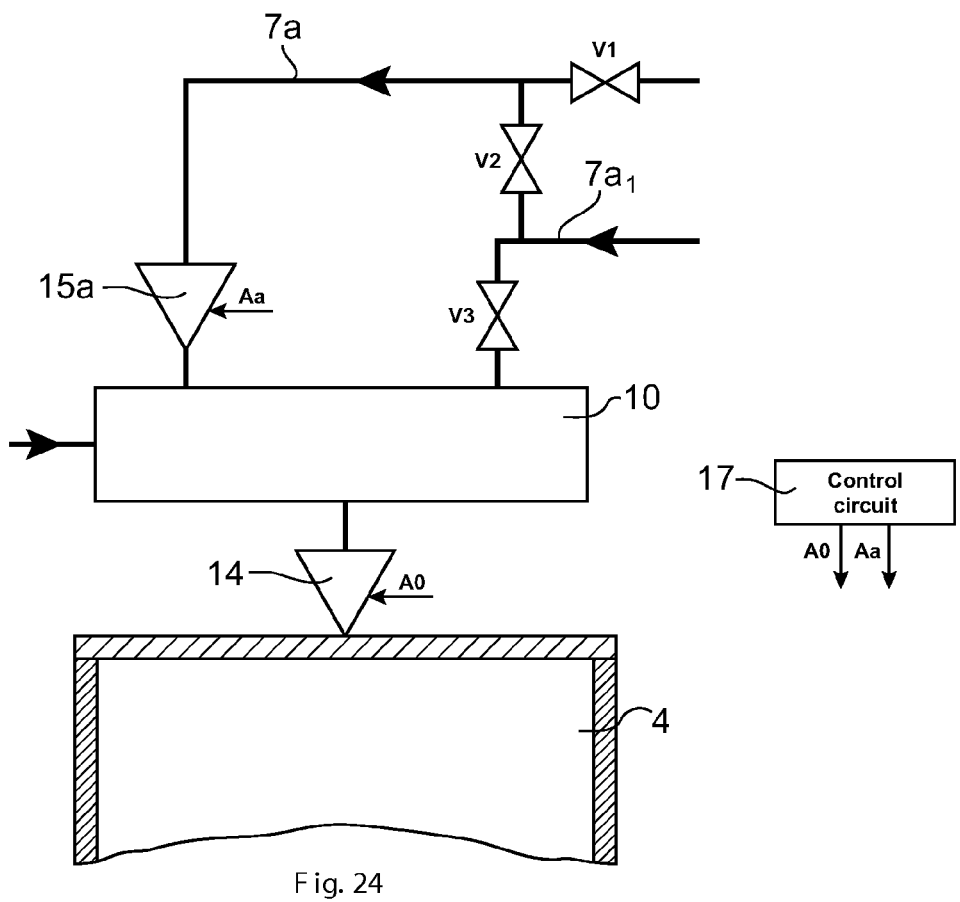

A rinsing of the mixing chamber 10 and the injector 14 can also be performed with a device such as that of FIG. 24, another embodiment of the invention. In this figure, references V1 to V3 designate "on-off" valves. Valve V1 is arranged on the precursor liquid supply line, and valve V3 on a rinsing solvent supply line 7$a_1$. This line 7$a_1$ leads to the chamber 10. In the rinsing phase, the precursor liquid supply valve V1 is first closed and a valve V2 is open, which valve V2 is arranged on a line connecting the two lines 7a and 7$a_1$, so that the rinsing solvent can communicate with the line 7a dedicated to the precursor liquid. The liquid and mixture injectors operate in pulse mode for a long enough time to ensure the complete rinsing of the precursor liquid line 7a. The valve V2 is then closed. The precursor liquid and mixture injectors 15a, 14 continue to operate in pulse mode until there is no more solvent in the precursor liquid line 7a. The valve V1 is then open so as to re-prime the precursor liquid line 7a. At this stage, the liquid injector 15a is no longer actuated. It remains in the closed state. The valve V3 is then open so as to clean the mixing chamber 10, and is then closed. The mixture injector 14 continues to operate in pulse mode until the solvent introduced in to the mixing chamber 10 is completely evacuated.

Figure 3:
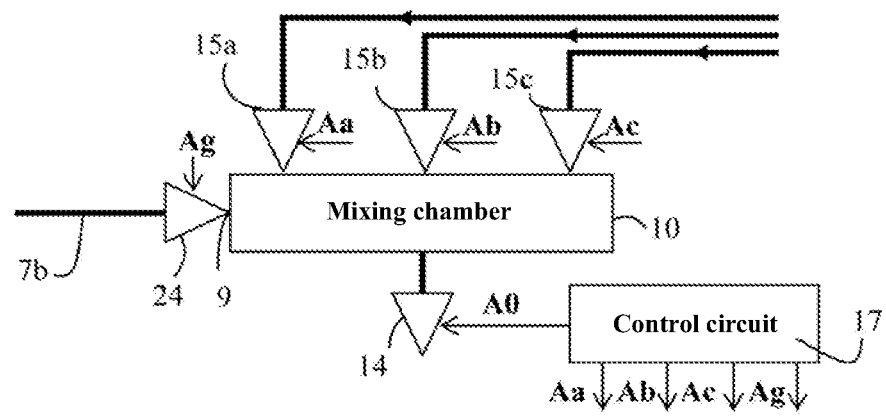

In another specific embodiment shown in FIG. 3, the introduction device is equipped with three injectors 15a, 15b and 15c arranged upstream of the mixing chamber 10. The three injectors 15a to 15c, also called liquid injectors, allow for the periodic injection of three different liquids into the mixing chamber 10. The introduction device 1 also comprises the injector 14, also called a mixture injector and arranged at the outlet of the mixing chamber. The injector 14 makes it possible to periodically introduce the content of the mixing chamber 10 into the evaporation chamber 4 and, more specifically, a mixture of carrier gas and droplets of one or more liquids. The control circuit 17 provides control signals Aa, Ab, Ac and A0 respectively controlling the opening and closing of injectors 15a, 15b, 15c and 14.

The carrier gas 2 can, for example, be periodically introduced into the mixing chamber 10, by means of an additional injector 24, also called a carrier gas injector and arranged upstream of the second inlet 9 of the mixing chamber 10. The inlet of the additional injector 24 is connected to the outlet of the conduit 7b. The control circuit 17 can also provide a control signal Ag controlling the opening and closing of said injector 24. This injector is described in reference to FIG. 3. It can also be used in the devices of FIGS. 1, 2 and those following.

An example of an application implementing such a device is the following. A sequence of controls of the various injectors as shown in FIGS. 25A to 25D makes it possible to more finely atomise the precursor liquid in the mixing chamber (difference in pressures between the liquid and the mixing chamber at the time of introduction of the liquid is greater), and to dry the chamber 10 after the transfer of the two-phase mixture from the mixing chamber 10 to the evaporation chamber 4. The risk of accumulation of the precursor liquid in the mixing chamber is then reduced without increasing the flow rate of the carrier gas. In FIGS. 25A, 25B and 25C, the controls $A_0$, $A_a$ and $A_g$ for opening injectors 14, 15 and 24 are shown. The sequence begins with an opening of the liquid injector 15. When this injector is closed, the gas injector 24 is open. During the opening of the latter, the mixture injector 14 is open, progressively introducing the mixture into the chamber 4. Then, this injector 14 is closed while injector 24 is closed earlier. FIG. 25D shows the pressure in the premixing chamber 10: this pressure changes according to different phases, from an initial pressure $P_0$ of chamber 10. A first phase I is a phase of introducing the liquid into the chamber (which corresponds to the duration of the opening of the injector 15); it is followed by a phase II of forming a two-phase mixture (that begins with the opening of the injector 24), and corresponds to the pressurisation of the mixing chamber, a phase III of transferring the two-phase mixture into the chamber 4 (which extends the opening of injector 14 to the closing of injector 24), and a phase IV of drying the mixing chamber (which corresponds to the closing of the injector 14). The maximum pressure $P_G$ in the chamber 10 is reached in phase II, shortly after the opening of the gas injector 24, and is equal to the pressure of the carrier gas.

Figure 2:
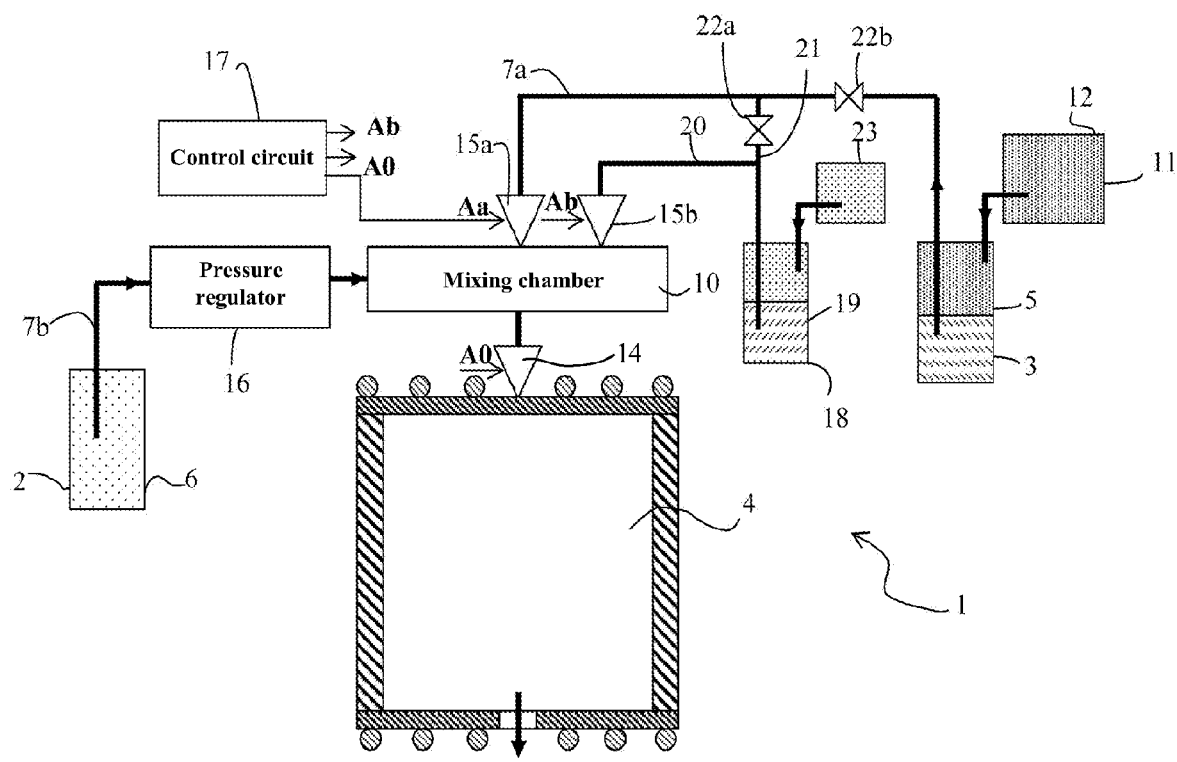

A similar control sequence can be applied in the case of a mixing chamber comprising a plurality of liquid injectors 15a, 15b, 15c as in FIG. 2 or 3. In this case, the injection of the different liquids (controls Aa, Ab, Ac) is not performed at the same time as the opening of the injector 14 (A0) or 24 (Ag).

Figure 4:
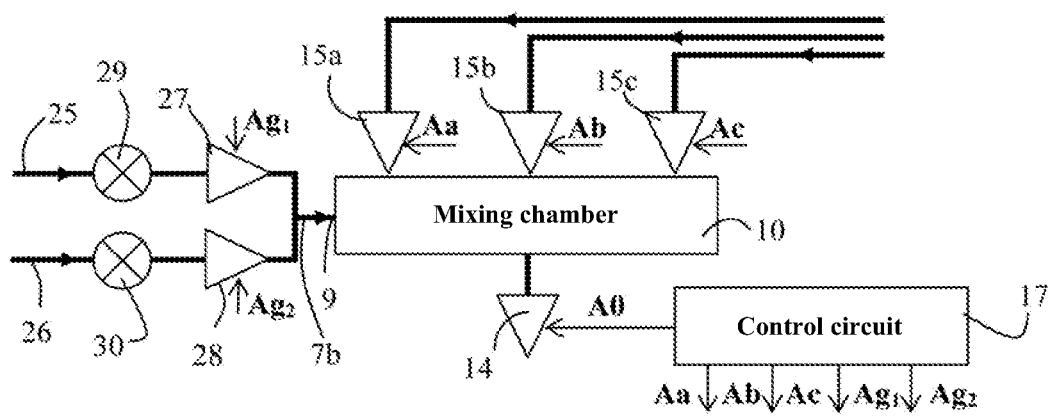

In an alternative embodiment shown in FIG. 4, the introduction of the carrier gas into the mixing chamber 10 is performed by means of two carrier gas conduits, or lines, 25 and 26, respectively connected to the inlets of two carrier gas injectors 27 and 28. The respective outlets of the injectors 27 and 28 are then each connected to a single conduit 7b of which the outlet corresponds to the inlet 9 of the mixing chamber 10. In addition, the conduits 25 and 26 are each equipped with a pressure regulator 29 and 30, arranged upstream of the corresponding injector.

Such a system for introducing the carrier gas into the mixing chamber makes it possible, in particular, to maintain the carrier gas, upstream of the mixing chamber 10, at two distinct predetermined pressures. For example, the carrier gas is maintained, in conduit 25, at a pressure $P_g^1$ greater than the pressure of the evaporation chamber 4 and lower than the pressures $P_1$ of the liquids intended to be injected by injectors 15a, 15b and 15c and each contained in their respective tank. In conduit 26, the pressure $P_g^2$ of the carrier gas is kept above the carrier gas pressure $P_g^1$ and optionally at the highest of the pressures $P_1$ of the liquids. Thus, for identical liquid pressures $P_1$ equal to 5 bars, the carrier gas can be kept at a pressure $P_g^1$ equal to 3 bars in conduit 25 and at a pressure $P_g^2$ equal to 8 bars in conduit 26.

The configuration described above in reference to FIG. 23, comprising a chamber for premixing with injected liquid, offers the advantage, over the configuration described above in reference to FIGS. 2 to 4 (a pre-chamber 10, an mixture injector 14 and two or more liquid injectors 15a, 15b, 15c, etc. on this pre-chamber 10), of making it possible to use two distinct liquid precursors without any risk of a chemical reaction between them, at least in the condensed phase. If the risk of a chemical reaction between the precursors does not exist, or if, on the contrary, a chemical reaction between the precursor liquids is desirable, the configuration with a chamber, a mixture injector and two or more liquid injectors on this same chamber, is a suitable and economically preferable solution.

The control circuit 17 can also provide control signals A0, Aa, Ab, Ac, Ag1 and Ag2, respectively intended to control the opening and closing of the injectors 14, 15a, 15b, 15c, 27 and 28 of FIG. 4. The control signals are preferably binary logic control signals. For example, FIGS. 5 to 8 show a specific mode for varying the control signals A0, Ag1, Ag2 and Aa, as a function of time, with the injectors 15b and 15c being considered to be inactive and therefore closed for the entire time period represented. Initially, the injector 27 is open (FIG. 6) while the other injectors 28 (FIG. 7), 15a (FIG. 8) and 14 (FIG. 5) are closed. The pressure in the mixing chamber 10 then corresponds to the pressure of the carrier gas $P_g^1$. The injector 27 thus remains open for a time period T1 during which an amount of liquid is introduced, by the injector 15a, into the mixing chamber 10 (FIG. 8). The liquid is thus introduced before the end of the period T1, into the mixing chamber, during a time period T2 shorter than T1, while the other injectors 14 and 28 remain closed. After the injector 27 is closed, the mixing chamber 10 is then pressurised by the opening of the injector 28 for a time period T3. After the injector 28 is open, the pressure inside the mixing chamber 10 is equal to the pressure $P_g^2$, preferably greater than $P_g^1$ and the pressure $P_1$ of the liquid. The mixture of carrier gas and liquid contained in the mixing chamber is then injected into the evaporation chamber, by opening injector 14 (FIG. 5), and almost simultaneously closing injector 28 (FIG. 7), then by opening injector 27 (FIG. 6). It is also possible to perform a plurality of openings of the injector 14 after an opening of the liquid injector and before the next opening of the liquid injector provided that the total duration of the opening of the injector 14 between two openings of the liquid injector is at least equal to 1 ms, for example 5 ms. The injection of the mixture into the evaporation chamber is then stopped by closing injector 14, while injector 27 remains open. The example given can be generalised to a plurality of liquids injected by injectors 15a, 15b, 15c, etc. by applying this strategy to each injector. It is possible, for example, to impose a constraint whereby two injectors are not open simultaneously.

Such a control sequence associated with the careful choice of different carrier gas $P_g^1$ and $P_g^2$ and liquid $P_1$ pressures, makes it possible to further improve the spray of the two-phase mixture in the evaporation chamber while maintaining a moderate carrier gas flow rate.

According to another specific embodiment, the control signal A0 of the mixture injector 14 can be a pulse having a predetermined duration so as to enable the entire amount of liquid, introduced into the mixing chamber between two consecutive openings of the first injector 14, to be transferred to the evaporation chamber. By way of the example shown in FIGS. 9 and 10, 100 mg of a liquid introduced beforehand into the mixing chamber 10 is injected with the carrier gas, in a pulse, into the evaporation chamber 4. The injection of the mixture is performed by means of a mixture injector 14 connected to the outlet of the mixing chamber 10. Means for measuring the instantaneous discharge rate of the injector 14 make it possible to typically obtain curves A and B respectively representing the instantaneous discharge rate and the accumulated mass of the liquid part contained in the mixture injected into the evaporation chamber 4. Curves A and B (FIG. 9) as well as curve C representing the control pulse of the injector 14 (FIG. 10), show that the duration of the opening $t_{inj}(A0)$ of the injector 14 is long enough to ensure the transfer, to the evaporation chamber, of all of the liquid, introduced into the mixing chamber prior to the opening of the injector 14. Indeed, at t=5 ms, the entirety of the liquid was transferred into the evaporation chamber while the duration of the opening of the injector 14 was on the order of 6.5 ms.

Without this condition on the duration of the opening of the injector 14, the amount of liquid in the mixing chamber would gradually increase and the quality of atomisation might be deteriorated therefrom. Moreover, in this case, the flow rate of the liquid introduced into the mixing chamber would no longer correspond to the flow rate of the liquid actually introduced into the evaporation chamber. It would then be difficult to control the evaporating device by measuring or controlling the flow rate of the liquid downstream of the mixing chamber.

Furthermore, the injector(s) used can be controlled in an open loop or in a closed loop. When a plurality of liquid and mixture injectors are used, said injectors can also be controlled so as to never open at the same time. The device can also comprise means for measuring the flow rate of liquids leaving each injector. If the different injectors are controlled in an open loop, i.e. there is a periodic repetition of the pulse controls, the pressure of the carrier gas, and the driving pressure of the liquid(s) introduced into the mixing chamber and the temperature of the mixing chamber 10 are controlled so as to ensure the repeatability of the vapour amounts produced in the evaporation chamber and the composition thereof. Attention is also drawn to the quality of the preliminary degassing of the conduits allowing for the transfer or the liquid(s) to the mixing chamber.

Figure 11:
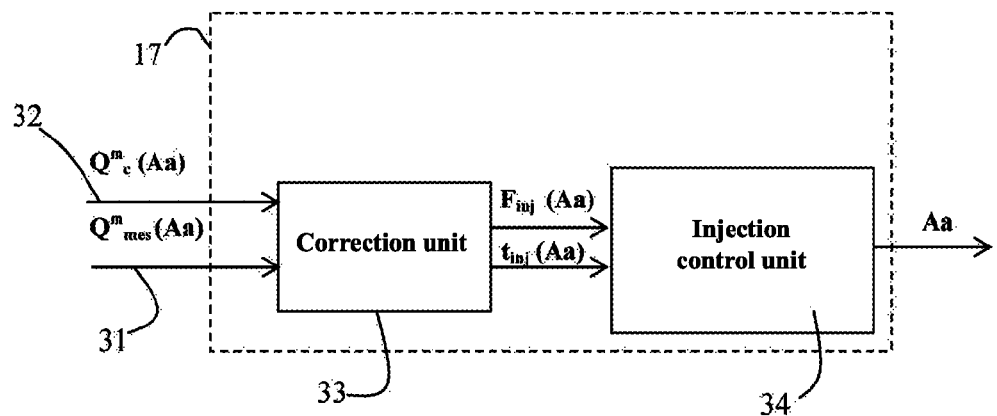

If the duration of the opening of the mixture injector 14 is sufficient, a closed-loop control of the injector(s) arranged upstream of the mixing chamber 10 makes it possible to overcome these difficulties by controlling the flow rates of the liquid(s) introduced into the mixing chamber 10 and therefore into the evaporation chamber 4. By way of example, as shown in FIG. 11, a liquid injector 15a, for example, such as that shown in FIG. 1, is controlled in a closed loop so as to keep the mean flow rate at the outlet of the injector 15a substantially constant. Thus, the control circuit 17 comprises two inlets 31 and 32 for the respective control of a signal $Q^m{}_{mes}(Aa)$ representing the flow rate to be regulated and a set point signal $Q^m{}_c(Aa)$. The inlet 31 is, for example, connected to the outlet of a flowmeter arranged on the conduit for the liquid to be injected (not shown). The set point value $Q^m{}_c(Aa)$ and the measured flow rate value $Q^m{}_{mes}(Aa)$ are processed by a correction unit 33, for example, including a PID (proportional-integral-derivative) corrector or, more generally, an RST corrector, which calculates at least one of the following control parameters: the injection frequency $F_{inj}(Aa)$ and the duration of the opening $t_{inj}(Aa)$. These control parameters are then managed by an injection control unit 34 that generates the control voltage (control signal Aa) of the injector 15a, so that the mean measured flow rate $Q^m{}_{mes}(Aa)$ converges toward the flow rate set point value $Q^m{}_c(Aa)$. Thus, the mean injection flow rate is adjusted to a predetermined set point value based on the measurement of the flow rate $Q^m{}_{mes}(Aa)$.

In general, the regulation of the flow rate of the liquid(s) injected into the mixing chamber 10 by one or more injectors 15a, 15b, . . . 15i, with one or more associated predetermined injection frequencies $F_{inj}(Aa)$, $F_{inj}(Ab)$, . . . $F_{inj}(Ai)$, can be done by modulating the durations of opening $t_{inj}(Aa)$, $t_{inj}(Ab)$, . . . $t_{inj}(Ai)$ of the injector(s) 15a, 15b, . . . 15i.

In a simple configuration, the injector 14 is controlled in an open loop.

Figure 12:
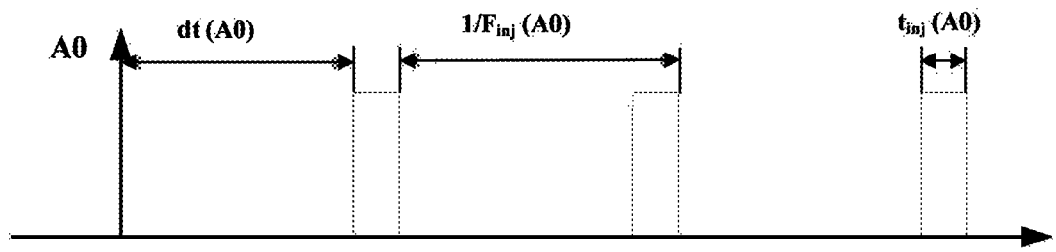
FIGS. 12 to 14 show a particular mode for varying the control signals A0, Aa and Ab of the different injectors of a device according to the invention, as a function of time.
Figure 13:
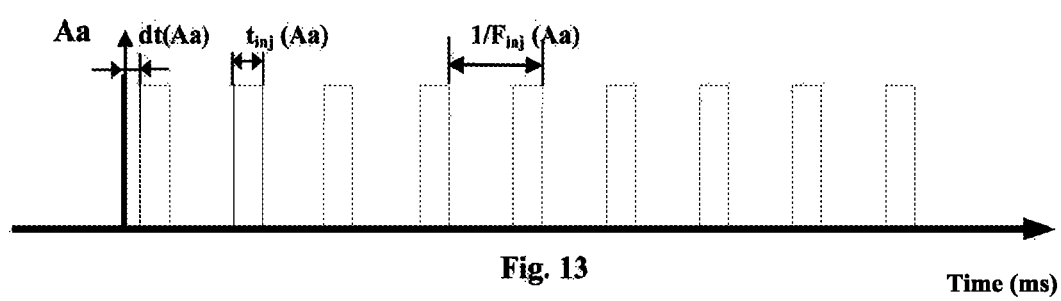
Figure 14:
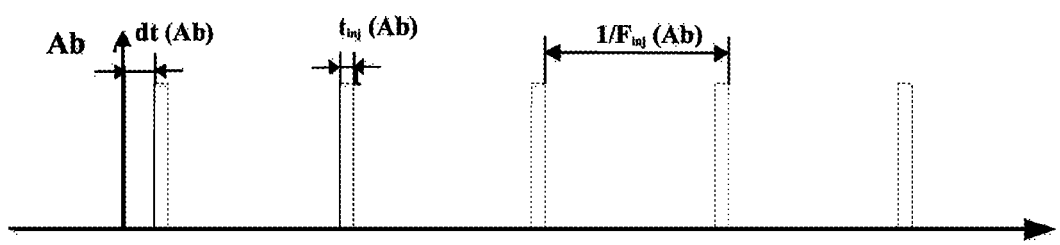

By way of example, FIGS. 12 to 14 respectively show the variations in the control signals A0, Aa and Ab of injectors 14, 15a and 15b, as a function of time, of an introduction device comprising two liquid injectors 15a and 15b arranged upstream of the mixing chamber 10 and a mixture injector 14 arranged at the outlet of the mixing chamber 10.

FIGS. 12 to 14 show the notations used. A starting time, common to all of the injectors 14, 15a and 15b, is chosen so that it always precedes the first opening of the injector that is the first to open. In FIGS. 12 to 14, the injector opening first is the liquid injector 15a. Each time lag dt(A0), dt(Aa) and dt(Ab) is then defined as the time that has passed between said starting time and the first opening of the associated injector. In FIGS. 12 to 14, the notations $1/F_{inj}(A0)$, $1/F_{inj}(Aa)$ and $1/F_{inj}(Ab)$ are the periods of control signals A0, Aa and Ab while $t_{inj}(A0)$, $t_{inj}(Aa)$ and $t_{inj}(Ab)$ represent the durations of the openings of the injectors 14, 15a and 15b during a respective period of their control.

FIGS. 12 to 14 thus show a particular embodiment in which the injector is never open if at least one of the injectors 15a or 15b is already open.

Without any specific condition on the values of the injection frequency, the lag time and the duration of the opening of the different injectors 14, 15a, 15b, . . . 15i, the injector 14 risks being open when at least one of the injectors 15a, 15b, . . . 15i, arranged upstream of the mixing chamber 10 is already open. This would also be the case if the liquid flow rates were regulated for predetermined opening durations, as the injection frequencies are modulated in order to minimise the deviations between the measured flow rates and the flow rate set points.

The injector control strategy can, if necessary, be refined so as to prevent, for example, a liquid injector 15h from being open at the same time as another liquid injector 15k or at the same time as the mixture injector 14. Additional constraints on the parameters for controlling the two injectors 15h and 15k are then required. The table below provides an example of this, for two injectors 15h and 15k, in which the control period of one of the injectors 15h or 15k is a multiple of the control period of the other injector 15k or 15h.

|  | If dt(Ah) < dt(Ak) | If dt(Ah) > dt(Ak) |
|---|---|---|
| The following are established: | dt'(Ak) = 0 (New starting time) and dt'(Ah) = E[dt(Ak) − dt(Ah)) · $F_{inj}(Ah)$] − (dt(Ak) − (dt(Ah)) · $F_{inj}(Ah)$ + $1/F_{inj}(Ah)$ | dt'(Ah) = 0 (New starting time) and dt'(Ak) = E[dt(Ah) − dt(Ak)) · $F_{inj}(Ak)$] − (dt(Ah) − (dt(Ak)) · $F_{inj}(Ak)$ + $1/F_{inj}(Ak)$ |
| If $1/F_{inj}(Ah) = p/F_{inj}(Ak)$, Pinteger > 0 | [dt'(Ah) + $t_{inj}(Ah)$] · $F_{inj}(Ak) \notin N^+$ and [dt'(Ah) − $t_{inj}(Ah)$] · $F_{inj}(Ak)$ > E{[dt'(Ah) + $t_{inj}(Ah)$] · $F_{inj}(Ak)$} | $t_{inj}(Ah) < dt'(Ak)$ |
| If $1/F_{inj}(Ak) = p/F_{inj}(Ah)$, Pinteger > 0 | $t_{inj}(Ak) < dt'(Ah)$ | [dt'(Ak) + $t_{inj}(Ak)$] · $F_{inj}(Ah) \notin N^+$ and [dt'(Ak) − $t_{inj}(Ah)$] · $F_{inj}(Ah)$ > E{[dt'(Ak) + $t_{inj}(Ak)$] · $F_{inj}(Ah)$} |
| If $F_{inj}(Ak) = F_{inj}(Ah)$ | $t_{inj}(Ak) < dt'(Ah)$ | $t_{inj}(Ah) < dt'(Ak)$ |

E represents the floor function (floor(x) being the largest integer less than or equal to x).

In the general case, the condition linking the injector control periods is less restricting. Preferably, each of the control periods is a multiple of a same period T: $1/F_{inj}(Ah)=mT$ and $1/F_{inj}(Ak)=nT$. However, in this case, the number of conditions that must be verified and that link the lag times, the opening durations and the control periods, is dependent on n and m. This number of conditions is generally much higher.

These constraints are not limiting and can be complemented by other constraints according to the control strategy desired. For example, in order for the injector 14 never to be open when at least one of the liquid injectors 15a or 15b is already open, injector 14 cannot open at the same time as injector 15a and injector 14 cannot open at the same time as injector 15b. Two condition tables similar to that presented above, respectively between injectors 14 and 15a and between injectors 14 and 15b, are thus verified.

In another embodiment, a pulse for opening A0 the injector 14 can be replaced by a train or a series of pulses and the frequency of the pulse train and/or the total duration of the opening of the injector 14 over a pulse train period can be controlled so that the entire amount of liquid(s) introduced into the mixing chamber 10 between two consecutive openings of the injector 14 is transferred to the evaporation chamber 4. Thus, the accumulated durations of the opening of the injector 14 over a series of pulses are preferably always long enough to enable the transfer, to the evaporation enclosure 4, of all of the liquid(s) introduced into the mixing chamber, before the injector 14 opens.

By way of the example shown in FIGS. 15 and 16, 100 mg of a liquid introduced beforehand into the mixing chamber 10 is introduced with the carrier gas, in a series of 3 pulses, into the evaporation chamber 4, by means of the injector 14 connected to the outlet of the mixing chamber 10. Means for measuring the instantaneous discharge rate of the injector 14 make it possible to typically obtain curves D and E respectively representing the instantaneous discharge rate and the accumulated mass of the liquid part contained in the mixture injected into the evaporation chamber 4. Curves D and E (FIG. 15) as well as curve F (FIG. 16) representing the series of pulses for control of the injector 14, show that the durations of the opening $t_{inj}^1(A0)$, $t_{inj}^2(A0)$ and $t_{inj}^3(A0)$ of the injector 14 are long enough to allow for the transfer, to the evaporation chamber, of all of the liquid, introduced into the mixing chamber prior to the opening of the injector 14. Indeed, at t=6 ms, the entirety of the liquid was transferred into the evaporation chamber 4, in three successive amounts $\Delta m1$, $\Delta m2$ and $\Delta m3$. Each pulse of the injector 14 therefore contributed to the introduction, into the evaporation chamber, of the liquid, separately and, in general, differently, i.e. the amounts of the liquid introduced into the evaporation chamber are different ($\Delta m1 \neq \Delta m2 \neq \Delta m3$), except in the case of a particular choice of the opening durations. This makes it possible to fraction the amount of liquid to be evaporated and therefore to improve the atomisation thereof. Over the course of the openings of the mixture injector the liquid/gas ratio is reduced and the spraying of the liquid is therefore increasingly optimised, in connection with the positive effect of the blowing of the carrier gas at each of the openings of the mixture injector.

In FIG. 17, the injector 14 intended to inject a mixture of carrier gas and liquid droplets is controlled by a series of four pulses (control signal A0), while FIGS. 18 and 19 respectively show the variations in the control signals Aa and Ab of two injectors 15a and 15b arranged upstream of the mixing chamber, as a function of time.

Thus, the pulse series of the injector 14 is defined by a frequency $F(A_0)$ and a lag time $dt(A0)$. $1/F(A0)$ corresponds to the time interval between two rising fronts of two series of successive pulses, while $dt(A_0)$ corresponds to the interval between a starting time common to all of the injectors and the rising front of the first series of pulses. In addition, within a series of pulses, the durations of the opening of the injector 14 are defined, respectively during the 4 pulses of the series: $t_{inj}^1(A0)$, $t_{inj}^2(A0)$, $t_{inj}^3(A0)$ and $t_{inj}^4(A0)$, as are the lag times between the falling front and the rising front of two successive pulses of a series: $\delta(A0, 1)$, $\delta(A0, 2)$ and $\delta(A0, 3)$.

The control signals Aa and Ab are respectively defined by the injection frequency $F_{inj}(Aa)$ and $F_{inj}(Ab)$, by the opening duration $t_{inj}(Aa)$ and $t_{inj}(Ab)$ and by the lag time $dt(Aa)$ and $dt(Ab)$ of each injector 15a and 15b. The lag time $dt(Aa)$ and $dt(Ab)$ of each injector 15a and 15b respectively correspond to the interval between a starting time common to all of the injectors and the rising front of the first pulses of injectors 15a and 15b.

As described above, numerous alternative controls are possible. The injectors arranged upstream of the mixing chamber can be controlled in an open loop or in a closed loop, the opening durations or frequencies being the regulation controls. The injector 14 can be controlled in an open loop, or synchronised on a control front of one of the injectors 15a, 15b, 15c arranged upstream of the mixing chamber 10, or controlled in a closed loop so as to precisely regulate the carrier gas flow rate.

Other regulation modes are possible. Thus, it is possible to implement a closed-loop regulation system that makes it possible to simultaneously control the flow rate(s) of the liquid(s) and the flow rate of the carrier gas by a specific control of the liquid injector(s) and the mixture injector. FIG. 26 shows a device of this type, comprising means or a unit 33 for correction, means or a unit 34a for controlling the mixture injector and means or a unit 34b for controlling the liquid injector 15a. Microprocessing means 35 store a control strategy. The means 33 receive mass flow $Q_m$ information, information on the measurement of the flow rates of the liquids injected ($Q^m{}_{mes}(A_0)$, $Q^m{}_{mes}(A_A)$), or on the set points for these injected liquid flow rates ($Q^m{}_c(A_0)$, $Q^m{}_c(A_A)$). Based on this information and the control strategy information of means 35, these means 33 develop controls for means 34a and 34b. Typically, these controls comprise an injection frequency functions $F_{inj}(A_0)$, $F_{inj}(A_a)$, an opening duration $t_{inj}(A_0)$ and $t_{inj}(A_a)$ and a lag time parameter $dt(A_0)$, $dt(A_a)$, which latter parameter is defined as the time that has passed since said starting time common to all of the injectors.

In the general case, the regulations of each of the fluid flow rates are not independent. The correction means 33 take into account the influence that the control application of the liquid injector may have on the carrier gas flow rate and, reciprocally, the influence that the control application of the mixture injector may have on the precursor liquid flow rate.

In addition, the correction means 33 can integrate various control strategies for the injectors provided by means 35. For example, it may be undesirable for the mixture injector to open if one of the liquid injectors is already open or for a liquid injector not to open if at least one other liquid injector is open. It may also be desirable, for example, to work at imposed injection frequencies or injector opening durations. The means 33 then calculate the control parameters of the injectors, which allow for a closed-loop regulation of the system, while respecting the predefined relations, which impose or mutually link the various parameters.

In addition, restrictive conditions that, for example, limit the choice of gas and liquid mass flow set points desired by the user can be taken into account. These conditions, which depend in general on the physicochemical properties of the fluids and the characteristics of the injection head are, for example, intended to prevent situations in which the mixing chamber is gradually filled with the precursor liquid(s) as a result of a liquid flow rate set point that is too high with respect to the carrier gas flow rate set point.

In the specific case of an introduction device having only one liquid injector 15a, the synchronisation of the mixture injector 14 on a control front of this liquid injector can make it possible to use the injection frequency as a control for a closed-loop control of the liquid flow rate while ensuring that the mixture injector never opens at the same time as the liquid injector.

The control strategies can also be refined, for example, so that:
- the injector 14 is never open when at least one of the injectors arranged upstream of the mixing chamber (15a and 15b) is open,
- none of the injectors 14, 15a and 15b opens simultaneously,
- a pulse train of injector 14 always follows the opening of injector 15a or 15b,
- at least one pulse train of injector 14 can periodically be performed when the mixing chamber contains no liquid, thereby constituting precise means for adjusting the partial gas and vapour pressures produced in the evaporation chamber.

Unlike the prior art, the introduction of a multiphase mixture, i.e. a mixture of carrier gas and one or more liquids, in a series of pulses, makes it possible, for each opening and closing of the injector 14, to introduce, into the evaporation chamber, smaller amounts of liquids than the static flow rate (mg/pulse) of the injectors arranged upstream of the mixing chamber. Indeed, the limit of the static flow calibrations of the injectors arranged upstream of the mixing chamber is generally around 0.2 mg/pulse, for pressure differences on the order of 3 bars, opening durations on the order of 0.5 ms and fluids with a viscosity similar to that of octane.

With an introduction device according to the prior art, the injection of liquid being performed directly into the evaporation chamber, it is possible to substantially lower the liquid driving pressure, so as to reduce the static flow of the injector. However, very quickly, the liquid is no longer atomised and falls drop-by-drop, rather randomly into the evaporation chamber. Thus, to achieve very low mean droplet flow rates, the only remaining parameter that can be adjusted is the control period of the liquid injector. However, this frequently exceeds one second, making closed-loop control difficult, and does not make it possible to overcome a significant fluctuation in the partial pressure of the vapours in the evaporation chamber. The introduction device according to the invention with an adapted control strategy makes it possible to limit the partial pressure fluctuations in the evaporation chamber, for very low mean liquid flow rates.

The invention is not limited to the embodiments described above. For example, the frequency and/or duration of the opening of at least one liquid injector 15a, arranged upstream of the first inlet 8 of the mixing chamber 10, can be controlled so that the liquid is introduced into the mixing chamber 10, in a series or train of injection pulses. Moreover, the pressure in the evaporation chamber 4 is preferably kept below that in the mixing chamber 10, and the pressure in the mixing chamber 10 is, for example, lower than that of the liquid(s), before their introduction into the mixing chamber 10. Finally, before their respective introduction into the mixing chamber 10, the pressure of the liquid(s) is generally regulated independently of the pressure of the carrier gas. The introduction device can, however, comprise means for controlling the difference in pressure between the liquid(s) before the introduction thereof into the mixing chamber and the carrier gas 2, by using, for example, differential pressure sensors.

The embodiments of FIGS. 27 to 30, in which references identical to those of the preceding figures designate identical or similar elements, make it possible to inject a gas/liquid mixture into an evaporator 4 by combining proportional valves or injectors for the control of the various flows (mixture, gas, liquid). A proportional valve 140 (FIGS. 28 to 30) or an injector 14 (FIG. 27) is arranged between the mixing chamber 10 and the evaporator 4.

Figure 27:
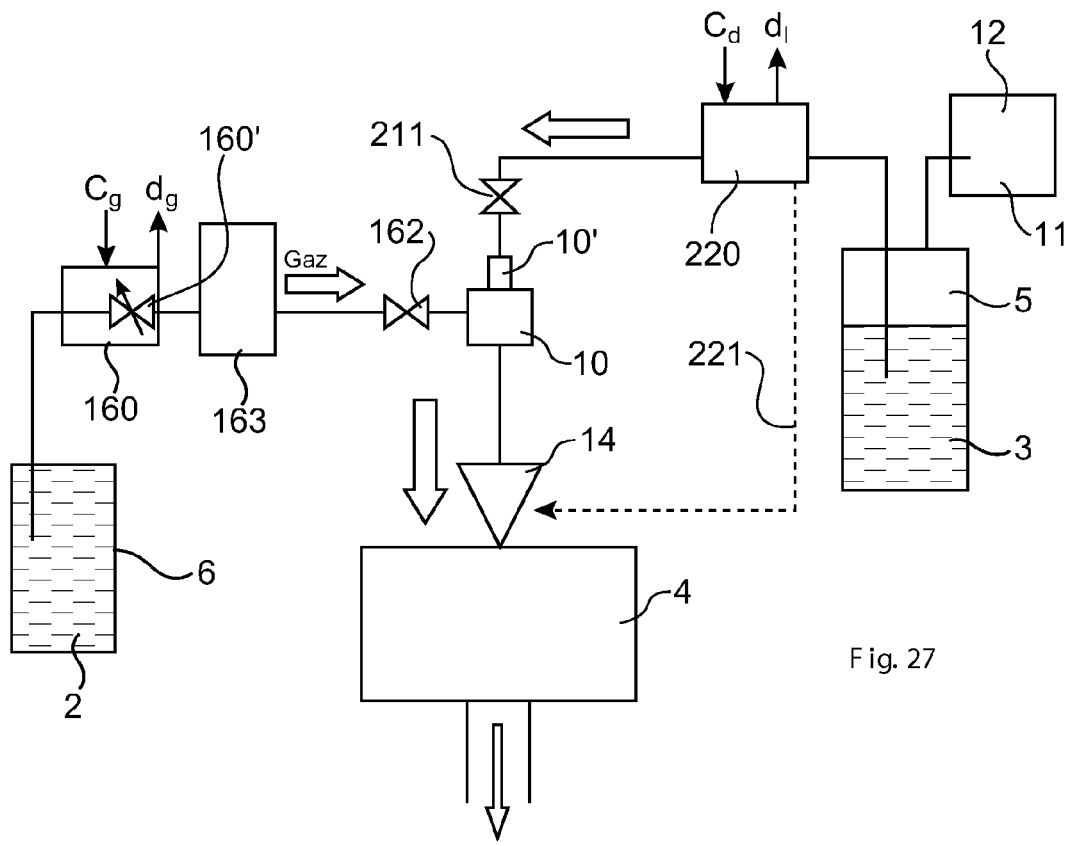
FIGS. 27 to 30 show specific embodiment of the devices according to the invention.
Figure 28:
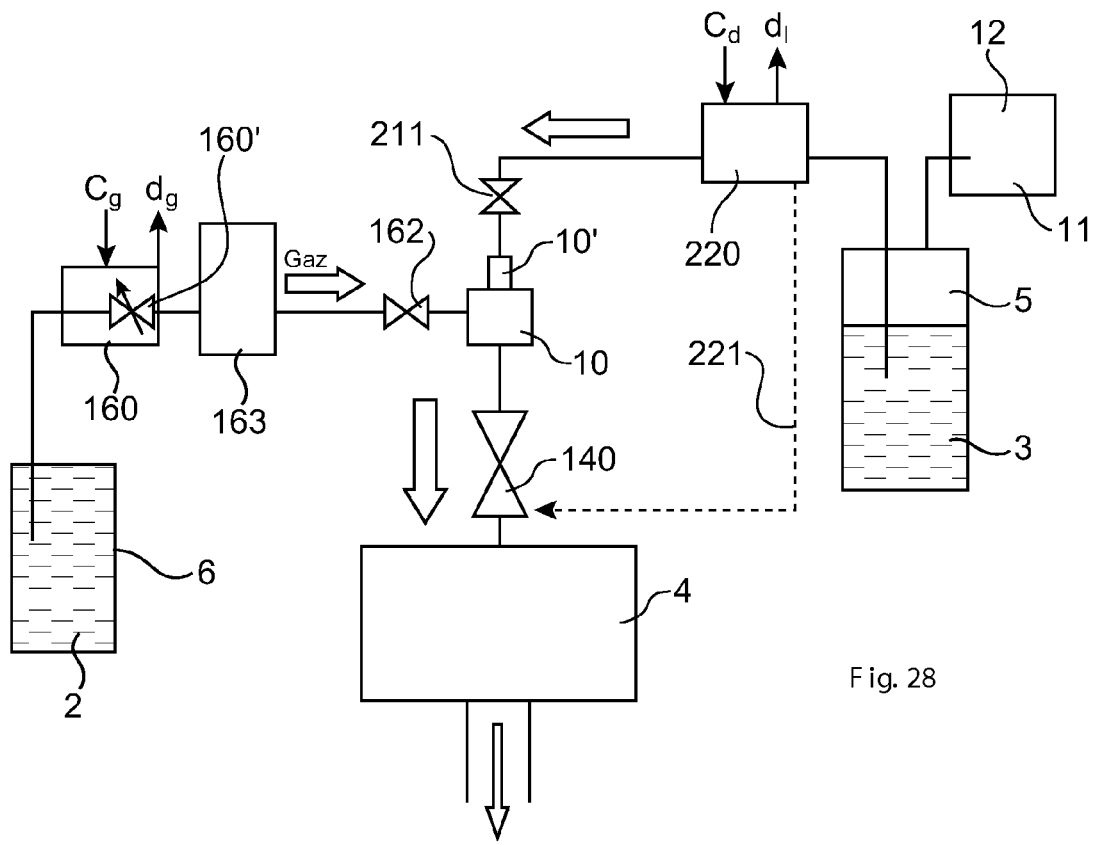

According to the embodiment of FIGS. 27 and 28, a two-phase mixture is injected, by means of an injector 14 and a proportional valve 140, respectively, into the evaporator 4. The injector 14 works in pulsed mode. Reference 10' designates (optional) means for spraying into the chamber 10. The control 221 for opening the valve 140 or the injector 14 originates from a liquid flowmeter 220. The latter can integrate the control circuit of the injector 14 or the valve 140, for example, using a PID or RST algorithm. It calculates, for example by means of a microprocessor, the control 221 of the valve 140 or the injector 14, so that the liquid flow rate dl, measured upstream of the valve 140, or the injector 14, and upstream of the point at which the liquid and the carrier gas are mixed (this mixing point is the chamber 10), is equal to a liquid flow rate set point Cd chosen by the operator.

Means for controlling the gas injection can comprise means 160 for controlling the carrier gas flow rate. According to a specific embodiment, the carrier gas flow rate dg can be controlled by a regulating flowmeter 160 on the basis of a flow rate set point Cg. This flowmeter comprises, for example, its own internal proportional valve 160' and a control circuit, and is located upstream of the point at which the liquid and the carrier gas are mixed. A stop valve 162 can be arranged on the path of the carrier gas. A buffer volume 163 can, in both cases, be provided on the path of the gas. Reference 211 is a stop valve (optional) on the path of the liquid from the flowmeter to the chamber 10.

In these two embodiments of FIGS. 27 and 28, the means for controlling the system for injection of the liquid solution or the liquid compound are realised by the measuring means 220 and the control 221. These embodiments of FIGS. 27 and 28 are compatible, for example, with one and/or the other of the structures of FIGS. 20A, 20B of FIG. 22 (injection of carrier gas directly into the evaporator 4), and FIGS. 23 and 24.

According to another embodiment (FIGS. 29 and 30), using a proportional valve 140, a two-phase mixture is injected into an evaporator 4. The control for opening 161 this valve originates from a gas flowmeter 160 that, by means of a PID or RST algorithm (a microprocessor can be implemented in the flowmeter), calculates the control of the valve 140, so that the gas flow rate dg measured upstream of the valve and upstream of the point at which the liquid and the carrier gas are mixed (this mixing point is the chamber 10), is equal to a gas flow rate set point Cg chosen by the operator. The liquid flow rate is controlled either by a regulating flowmeter 220 comprising its own internal proportional valve 220' and a control circuit, or by the combination of a liquid flowmeter and a liquid injector that would also be located upstream of the point at which the liquid and the carrier gas are mixed.

Figure 30:
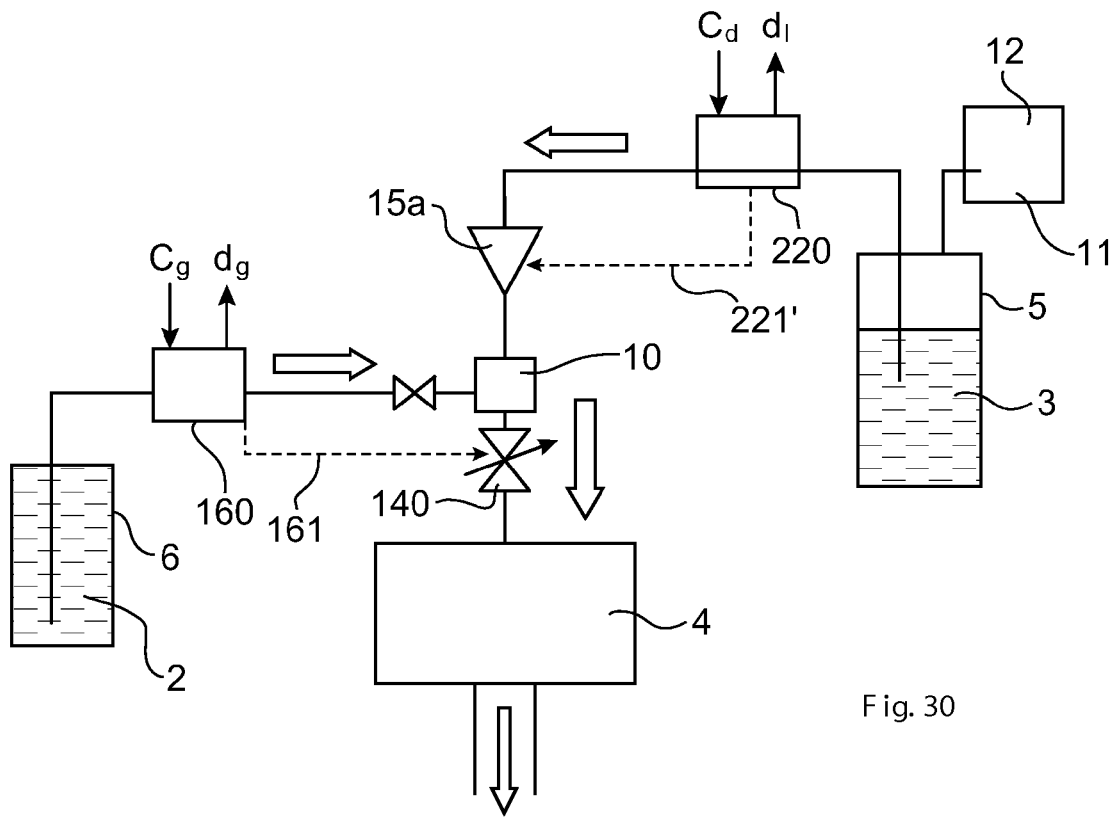

In FIG. 30, the injector 15a, located upstream of the mixing chamber 10, is controlled by the regulating flowmeter 220 by means of a control 221' developed, as explained above, as a function of Cd and dl, while the valve 140 is controlled as described above.

Figure 29:
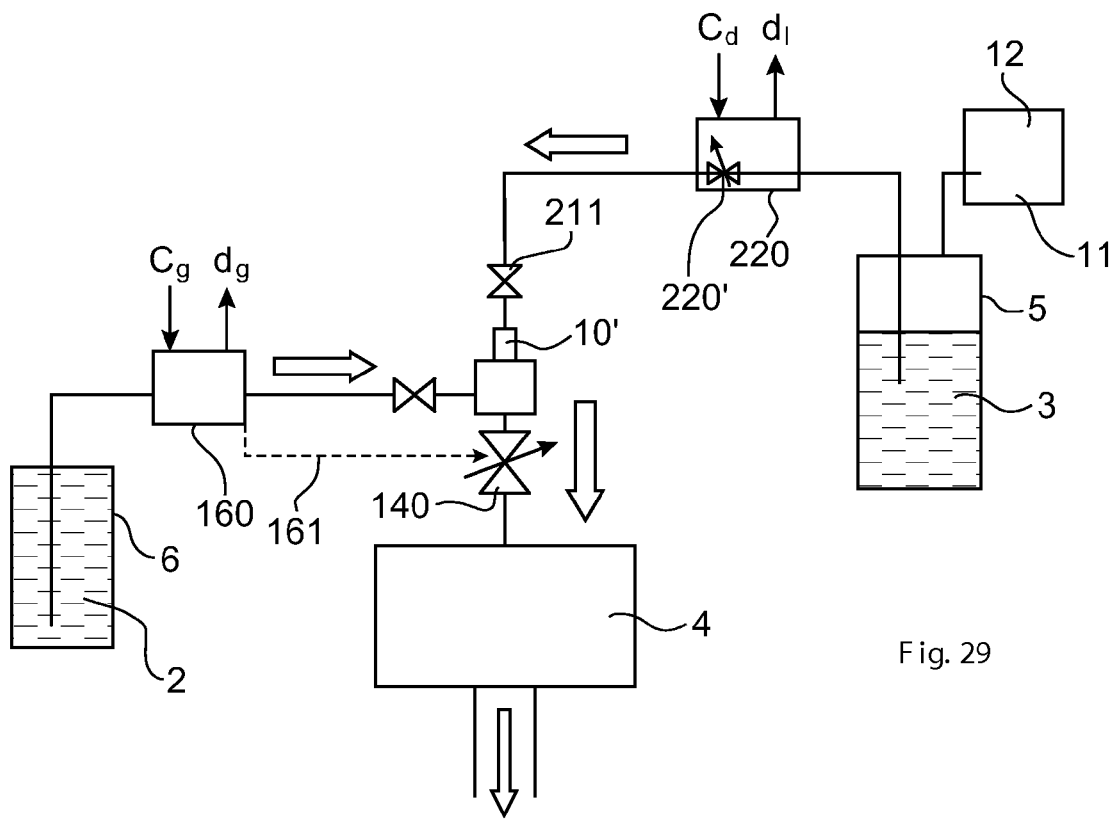

These embodiments of FIGS. 29 and 30 are compatible, for example, with one and/or the other of the structures of FIGS. 2, 3, 4, 20A, 20B, 22, 23 and 24.

These embodiments of FIGS. 28, 29 and 30 operate in a mode of continuous injection into the evaporator. They enable a two-phase mixture to be continuously injected into the evaporator.

Regardless of the embodiment chosen for the invention, the flow rate of the carrier gas introduced into the evaporator 4 can be measured. According to yet another embodiment of the invention, it is possible to measure (for example, with an ultrasound acoustic counter, or a cell for measuring thermal conditions used in vapour phase chromatography), downstream of the evaporator 4, in the gaseous mixture being discharged, the vapour concentration resulting from the evaporation of the liquid. This measurement can be compared to a set point chosen by the operator. This comparison enables an algorithm (PID or RST) to calculate, in real time, the injection or control parameters or the flow rate of the liquid introduced into the mixing chamber 10, so that the concentration read is equal to the set point.

Figure 31:
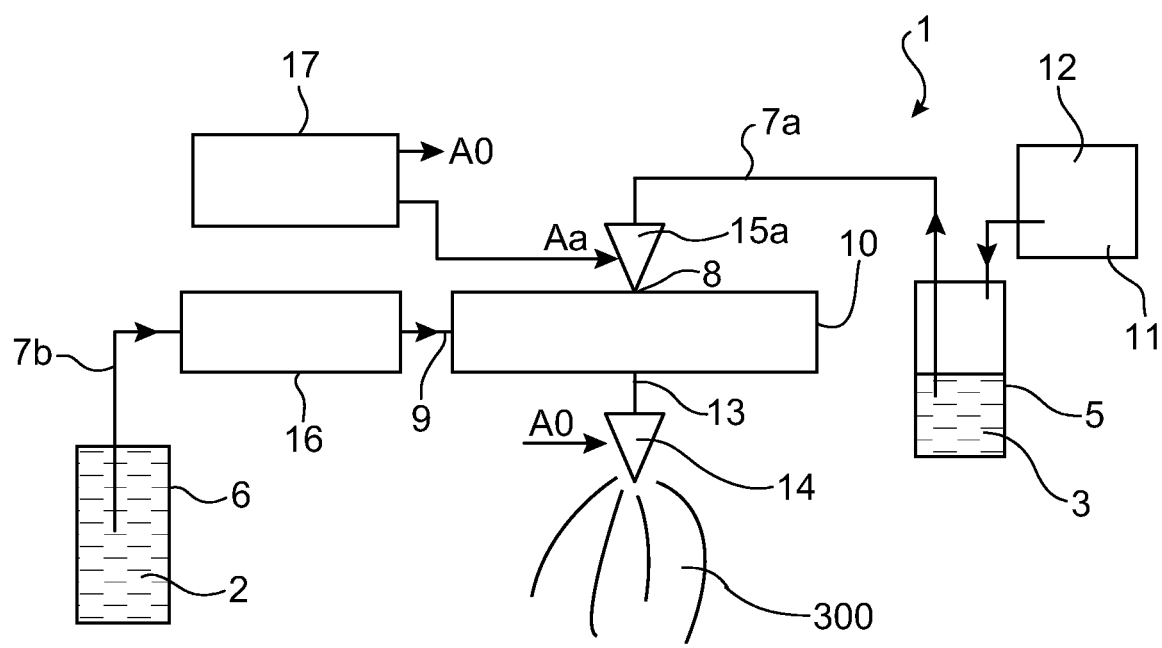
FIG. 31 shows another device according to the invention and one of the applications thereof.

The excellent performance for atomisation of the liquid using a device according to the invention make it possible to produce, as shown in FIG. 31, an assembly comprising a liquid injector according to the invention, at least one mixing chamber 10 and a mixture injector 14, which assembly forms an aerosol generating device 300. Such a device can be used in installations implementing "pyrosol" or "spray pyrolysis" processes, which consist of pyrolysing an aerosol in order to generate either a thin film or particles. In FIG. 31, the numeric references are, for the most part, identical to those of FIG. 1 and therefore designate identical or similar objects. An aerosol generating device according to the invention can be produced from any other configuration among those explained above: the chamber 4 is then eliminated, but all other considerations above apply, in particular those concerning the means for regulating the opening of the injection means 15*a*, 14.

The invention claimed is:

1. A method for implementing a device for injecting or spraying a mixture of carrier gas and at least one liquid compound or at least one liquid solution comprising at least one dissolved liquid, solid or gaseous compound, the device comprising at least one mixing chamber and an evaporation chamber, the device further comprising at least one inlet for admission of said compounds or said solution and a controller controlling a periodic injection or a periodic spray, by an injector, of said mixture, wherein the inlet for admission of said compound or said solution constitutes at least one first inlet of the at least one mixing chamber comprising at least one second inlet for admission of the carrier gas and an outlet connected to an inlet of said injector, so that said periodic injection or periodic spray is performed by injecting or spraying a mixture of carrier gas and droplets of said compound or said solution, through a single outlet of said injector into the evaporation chamber, further comprising the step of selectively controlling an injection frequency and/or a duration of opening the injector.

2. The method according to claim 1, wherein the duration of the opening of said injector being controlled so that an entire amount of liquid compounds or of the liquid solution introduced into the mixing chamber between two successive openings of said injector is injected toward the evaporation chamber or is emitted in aerosol form.

3. The method according to claim 1, wherein the frequency and/or duration of the opening of said injector being controlled so that an entire amount of liquid compounds or of the liquid solution introduced into the mixing chamber between two successive openings of said injector is injected into the evaporation chamber or is emitted in aerosol form, in a series of injection pulses.

4. The method according to claim 1, further comprising the step of selectively controlling the frequency and/or duration of opening at least one injector that is arranged upstream of the first inlet of the at least one mixing chamber, for periodically injecting said liquid compounds or said solution into said mixing chamber, wherein the at least one injector that is arranged upstream of the first inlet is controlled so that the liquid compounds or the liquid solution are introduced into this mixing chamber in a series of injection pulses.

5. The method according to claim 1, wherein the pressure in the evaporation chamber is kept lower than that in the mixing chamber, and the pressure in the mixing chamber is kept at a pressure lower than that of the liquid compounds or of the liquid solution, before introduction thereof into the mixing chamber.

6. The method according to claim 1, further comprising the step of controlling the difference in pressure between the carrier gas and the liquid compounds or the liquid solution, before the respective introduction thereof into the mixing chamber.

* * * * *

UNITED STATES PATENT AND TRADEMARK OFFICE
CERTIFICATE OF CORRECTION

PATENT NO. : 8,584,965 B2
APPLICATION NO. : 12/297861
DATED : November 19, 2013
INVENTOR(S) : Herve Guillon et al.

It is certified that error appears in the above-identified patent and that said Letters Patent is hereby corrected as shown below:

In the Specification, column 1, line 16, please replace "60/81,0529" with --60/810,529--.

Signed and Sealed this
Twenty-fifth Day of February, 2014

Michelle K. Lee
*Deputy Director of the United States Patent and Trademark Office*